(12) United States Patent
Park

(10) Patent No.: US 11,830,423 B2
(45) Date of Patent: Nov. 28, 2023

(54) TRANSPARENT DISPLAY DEVICE

(71) Applicant: LG Display Co., Ltd., Seoul (KR)

(72) Inventor: Jaehee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/555,918

(22) Filed: Dec. 20, 2021

(65) Prior Publication Data

US 2022/0199009 A1 Jun. 23, 2022

(30) Foreign Application Priority Data

Dec. 22, 2020 (KR) .................. 10-2020-0181304

(51) Int. Cl.
*G09G 3/3225* (2016.01)
*H10K 59/131* (2023.01)
*H10K 59/35* (2023.01)

(52) U.S. Cl.
CPC ......... *G09G 3/3225* (2013.01); *H10K 59/131* (2023.02); *H10K 59/353* (2023.02);
(Continued)

(58) Field of Classification Search
CPC ... G09G 2300/0426; G09G 2300/0452; G09G 2300/0876; G09G 3/3225;
(Continued)

(56) References Cited

U.S. PATENT DOCUMENTS

| 10,756,136 B1 | 8/2020 | Ma et al. |
| 2014/0028937 A1* | 1/2014 | Uchida ............. G02F 1/136213 349/41 |

(Continued)

FOREIGN PATENT DOCUMENTS

| JP | 2015079758 A | 4/2015 |
| JP | 2020187998 A | 11/2020 |

(Continued)

*Primary Examiner* — Kenneth Bukowski
(74) *Attorney, Agent, or Firm* — Seed IP Law Group LLP

(57) ABSTRACT

A transparent display device that may prevent deterioration of light transmittance, which is caused by a repair line, from occurring. The transparent display device comprises a plurality of first signal lines extended in a first direction and spaced apart from each other, a plurality of second signal lines extended in a second direction and spaced apart from each other, a transmissive area provided between two adjacent first signal lines and between two adjacent second signal lines, a pixel including a plurality of subpixels disposed based on an overlapping area where the first signal line and the second signal line cross each other, a first electrode provided in each of the plurality of subpixels, including a first side and a second side, which are disposed to be adjacent to the transmissive area and have an inclination with respect to each of the first signal line and the second signal line, a circuit area connected with the first electrode through a contact hole disposed to be adjacent to the first side of the first electrode, and an anode line extended from the second side of the first electrode of each of the plurality of subpixels and at least partially overlapped with a circuit area of an adjacent subpixel of the same color.

22 Claims, 11 Drawing Sheets

(52) U.S. Cl.
CPC ............... *G09G 2300/0426* (2013.01); *G09G 2300/0452* (2013.01); *G09G 2300/0876* (2013.01)

(58) Field of Classification Search
CPC ........... H01L 2251/568; H01L 27/3213; H01L 27/3218; H01L 27/326; H01L 27/3276; H01L 51/5209
See application file for complete search history.

(56) References Cited

U.S. PATENT DOCUMENTS

| | | | |
|---|---|---|---|
| 2016/0315133 A1* | 10/2016 | Sato | .................... H01L 27/3213 |
| 2017/0053971 A1* | 2/2017 | Sato | .................... H01L 51/5209 |
| 2017/0278915 A1 | 9/2017 | Jung | |
| 2019/0295482 A1* | 9/2019 | Sasaki | ............... G02F 1/136286 |
| 2020/0013992 A1 | 1/2020 | Cheng | |
| 2020/0365664 A1 | 11/2020 | Jeon et al. | |
| 2020/0381489 A1 | 12/2020 | Hwang et al. | |
| 2021/0399062 A1* | 12/2021 | Han | ..................... H10K 59/122 |
| 2022/0093702 A1* | 3/2022 | Zhang | ................. H01L 27/3218 |

FOREIGN PATENT DOCUMENTS

| | | | |
|---|---|---|---|
| JP | 2020532754 A | 11/2020 | |
| JP | 2020194158 A | 12/2020 | |
| WO | WO 2020105015 A1 | 5/2020 | |

\* cited by examiner

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit light, and a non-transmissive area. The transparent display device may have high light transmittance in the display area through the transmissive area.

BRIEF SUMMARY

The inventors of the present disclosure have appreciated that when a defective subpixel occurs, a Weighted Data for Redundancy (WDR) technique for normally operating the defective subpixel using a repair line may be applied to a transparent display device. However, the inventors have recognized that in the transparent display device to which the WDR technique is applied, a size of a transmissive area may be reduced by the repair line, whereby light transmittance may be deteriorated.

The present disclosure has been made in view of various technical problems including the above problems, and various embodiments of the present disclosure provide a transparent display device that may prevent decrease of light transmittance, which is caused by a repair line, from occurring.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a plurality of first signal lines extended in a first direction and spaced apart from each other, a plurality of second signal lines extended in a second direction and spaced apart from each other, a transmissive area provided between two adjacent first signal lines and between two adjacent second signal lines, a pixel including a plurality of subpixels disposed based on an overlapping area where the first signal line and the second signal line cross each other, a first electrode provided in each of the plurality of subpixels, including a first side and a second side, which are disposed to be adjacent to the transmissive area and have an inclination with respect to each of the first signal line and the second signal line, a circuit area connected with the first electrode through a contact hole disposed to be adjacent to the first side of the first electrode, and an anode line extended from the second side of the first electrode of each of the plurality of subpixels and at least partially overlapped with a circuit area of an adjacent subpixel of the same color.

In accordance with another aspect of the present disclosure, the above and other technical benefits can be accomplished by the provision of a transparent display device comprising a plurality of first signal lines extended in a first direction and spaced apart from each other, a plurality of second signal lines extended in a second direction and spaced apart from each other, a transmissive area provided between two adjacent first signal lines and between two adjacent second signal lines, a pixel including a plurality of subpixels disposed based on an overlapping area where the first signal line and the second signal line cross each other, a first electrode provided in each of the plurality of subpixels, a circuit area connected with the first electrode through a contact hole, and an anode line extended from a first electrode of each of the plurality of subpixels and at least partially overlapped with a circuit area of an adjacent subpixel of the same color. The pixel includes a plurality of sides having an inclination with respect to each of the first signal line and the second signal line, and at least one anode line is disposed to be adjacent to each of the plurality of sides of the pixel.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
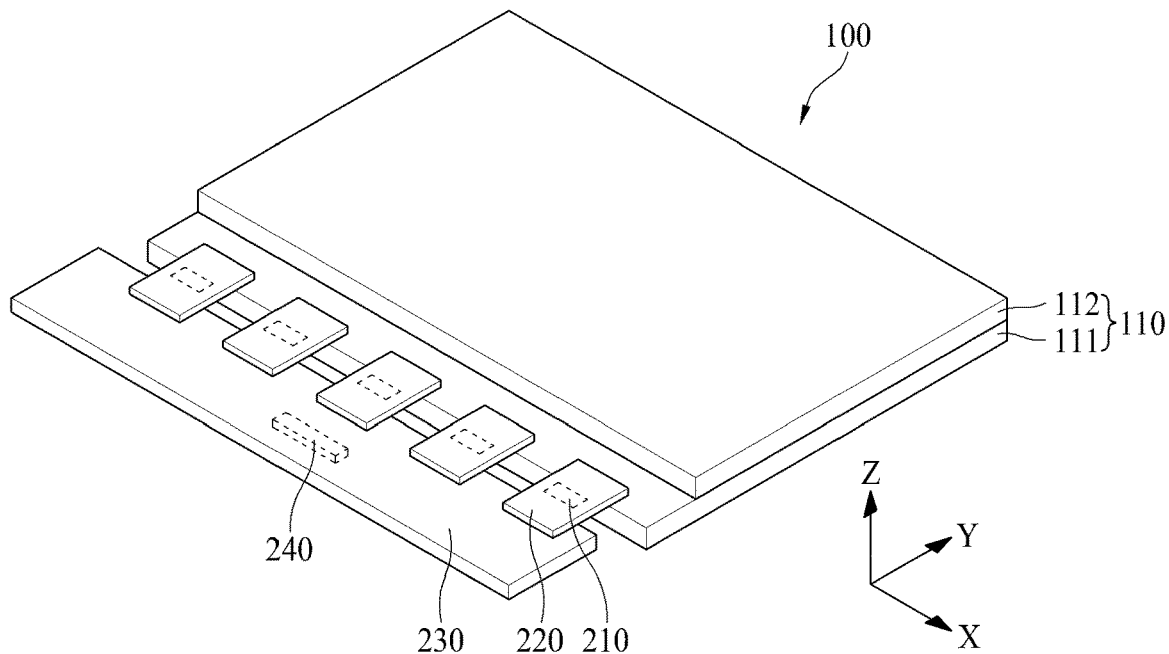
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

The term 'parallel' used herein includes the plain dictionary meaning of the term 'parallel' as well as 'substantially parallel.' For example, even if a first signal line and a second signal line is not parallel but substantially parallel to the point that a person of ordinary skill in the art understands it as practicing the features and embodiments of the present disclosure, then this is understood as being within the scope of 'substantially parallel.' Similarly, the term 'perpendicular' used herein includes the plain dictionary meaning of the term 'perpendicular' as well as 'substantially perpendicular.' For example, even if a first signal line and a second signal line is not perpendicular but substantially perpendicular to the point that a person of ordinary skill in the art understands it as practicing the features and embodiments of the present disclosure, then this is understood as being within the scope of 'substantially perpendicular.' In some embodiments, the term 'substantially' includes a variation range of about 1% to 2% from the original value.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
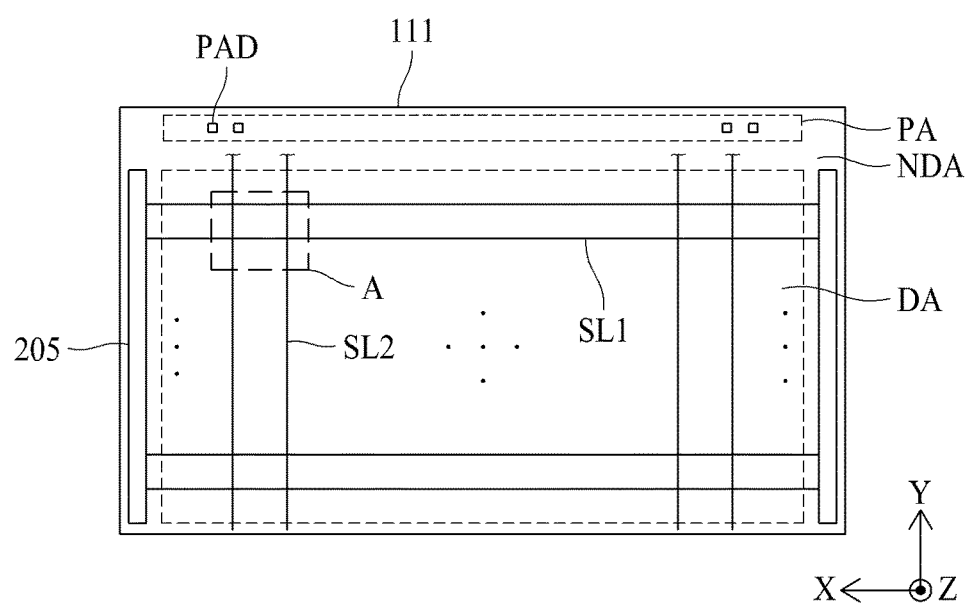
FIG. 2 is a schematic plane view illustrating a transparent display panel according to one embodiment of the present disclosure.
Figure 3:
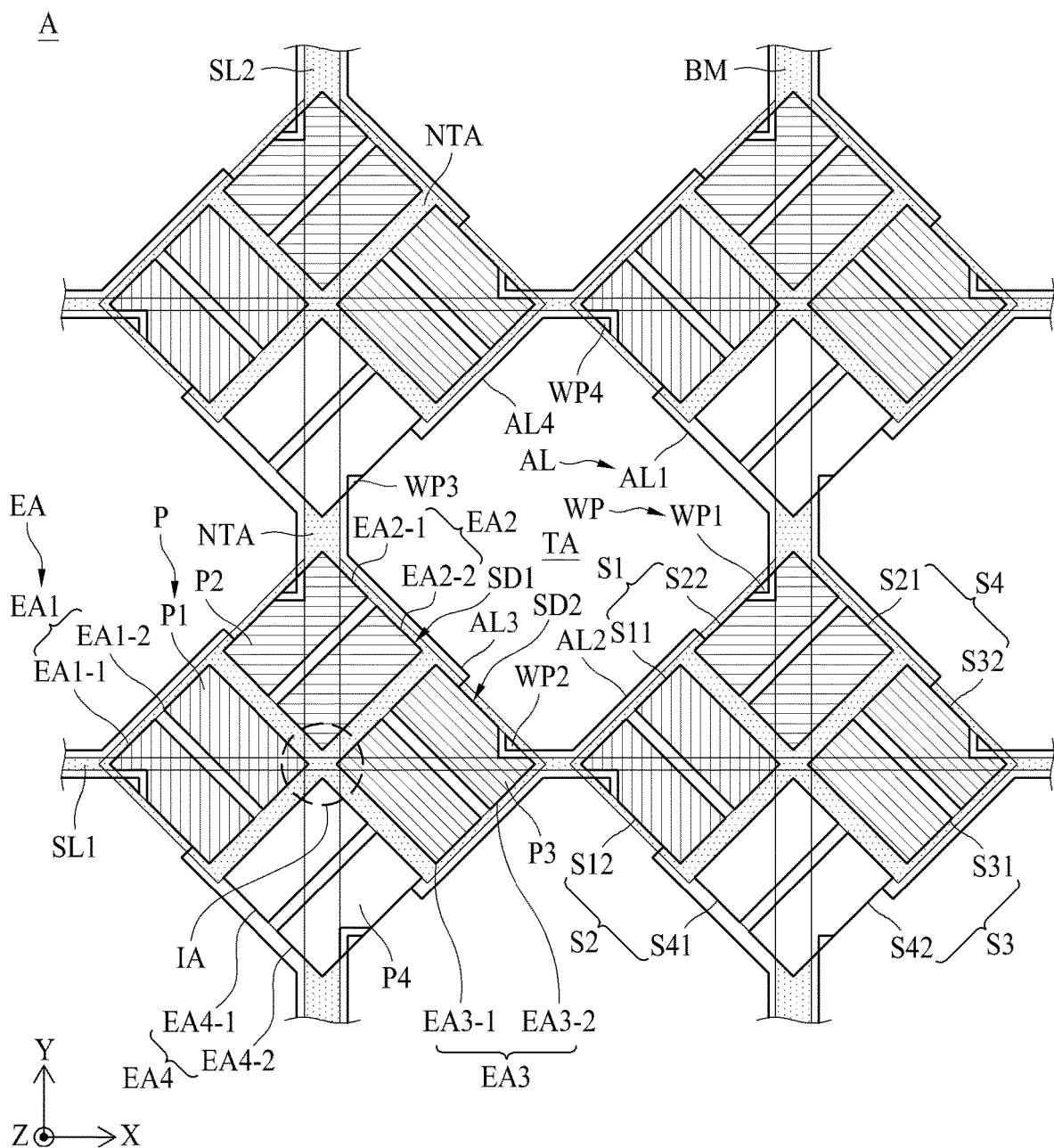
FIG. 3 is an enlarged view illustrating an area A of FIG. 2.

FIG. 2 is a schematic plane view illustrating a transparent display panel according to one embodiment of the present disclosure, and FIG. 3 is an enlarged view illustrating an area A of FIG. 2.

Referring to FIG. 2 and FIG. 3, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines and supplies scan signals to the scan lines. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided only in one side of the display area DA of the transparent display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

The non-transmissive area NTA may include a plurality of pixels P, and a plurality of first signal lines SL1 and a plurality of second signal lines SL2 to supply signals to each of a plurality of pixels P.

The plurality of first signal lines SL1 may be extended in a first direction (e.g., X-axis direction). The plurality of first signal lines SL1 may cross the plurality of second signal lines SL2. For example, each of the plurality of first signal lines SL1 may include at least one scan line.

Hereinafter, when the first signal line SL1 includes a plurality of lines, one first signal line SL1 may refer to a signal line group including a plurality of lines. For example, when the first signal line SL1 includes two scan lines, one first signal line SL1 may refer to a signal line group including two scan lines.

The plurality of second signal lines SL2 may be extended in a second direction (e.g., Y-axis direction). For example, each of the plurality of second signal lines SL2 may include at least one of at least one data line, a pixel power line, a reference line, or a common power line.

Hereinafter, when the second signal line SL2 includes a plurality of lines, one second signal line SL2 may refer to a signal line group including a plurality of lines. For example, when the second signal line SL2 includes two data lines, a pixel power line, a common power line, and a reference line, one second signal line SL2 may refer to a signal line group including two data lines, a pixel power line, a common power line, and a reference line.

A transmissive area TA may be disposed between the first signal lines SL1 adjacent to each other. In addition, a transmissive area TA may be disposed between the second signal lines SL2 adjacent to each other. That is, the transmissive area TA may be surrounded by two first signal lines SL1 and two second signal lines SL2.

Pixels P may be provided to overlap at least one of the first signal line SL1 and the second signal line SL2, thereby emitting predetermined (or selected) light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a first color. The second subpixel P2 may include a second emission area EA2 emitting light of a second color. The third subpixel P3 may include a third emission area EA3 emitting light of a third color. The fourth subpixel P4 may include a fourth emission area EA4 emitting light of a fourth color.

In one embodiment, the first to fourth emission area EA1, EA2, EA3 and EA4 may emit light of different colors. For example, the first emission area EA1 may emit light of a green color, the second emission area EA2 may emit light of a red color, the third emission area EA3 may emit light of a blue color, and the fourth emission area EA4 may emit light of a white color. However, the emission areas are not limited to this example.

In another embodiment, at least two of the first to fourth emission area EA1, EA2, EA3 and EA4 may emit light of same color. For example, the first emission area EA1 and the second emission area EA2 may emit light of a green color, the third emission area EA3 may emit light of a red color, and the fourth emission area EA4 may emit light of a blue color. However, the emission areas are not limited to this example.

Also, the arrangement order of the subpixels P1, P2, P3 and P4 may be changed in various ways.

Hereinafter, for convenience of description, the description will be given based on that a first subpixel P1 is a green subpixel emitting green light, a second subpixel P2 is a red subpixel emitting red light, a third subpixel P3 is a blue subpixel emitting blue light, and a fourth subpixel P4 is a white subpixel emitting white light.

The plurality of subpixels P1, P2, P3 and P4 may include a plurality of light emission areas divided from light emission areas EA1, EA2, EA3 and EA4. In detail, the first light emission area EA1 provided in the first subpixel P1 may include two divided emission areas, that is, a first divided light emission area EA1-1 and a second divided light emission area EA1-2. The second light emission area EA2 provided in the second subpixel P2 may include two divided emission areas, that is, a first divided light emission area EA2-1 and a second divided light emission area EA2-2. The third light emission area EA3 provided in the third subpixel P3 may include two divided emission areas, that is, a first divided light emission area EA3-1 and a second divided light emission area EA3-2. The fourth light emission area EA4 provided in the fourth subpixel P4 may include two divided emission areas, that is, a first divided light emission area EA4-1 and a second divided light emission area EA4-2.

In the transparent display panel 110 according to one embodiment of the present disclosure, the pixel P may include a plurality of sides facing the transmissive area TA, and each of the plurality of sides of the pixel P may have an inclination with respect to each of the first signal line SL1 and the second signal line SL2.

In detail, the pixel P may include a first side S1 and a second side S2, which face the transmissive area TA, a third side S3 facing the first side S1, and a fourth side S4 facing the second side S2. For example, the pixel P may have a rhombus shape comprised of four sides S1, S2, S3 and S4. In this case, the transmissive area TA may have a rhombus shape, a hexagonal shape, or an octagonal shape depending on the size and arrangement of the pixel P.

Each of the first side S1, the second side S2, the third side S3, and the fourth side S4 of the pixel P may have an inclination without being parallel with or perpendicular to the first signal line SL1. That is, each of the first side S1, the second side S2, the third side S3 and the fourth side S4 of the pixel P may have an inclination greater than 0 and less than 90 with respect to the first signal line SL1. For example, each of the first side S1, the second side S2, the third side S3 and the fourth side S4 of the pixel P may be a diagonal line having an inclination greater than 30 and less than 60 with respect to the first signal line SL1.

In addition, each of the first side S1, the second side S2, the third side S3, and the fourth side S4 of the pixel P may have an inclination not parallel with or perpendicular to the second signal line SL2. That is, each of the first side S1, the second side S2, the third side S3, and the fourth side S4 of the pixel P may have an inclination greater than 0 and less than 90 with respect to the second signal line SL2. For example, each of the first side S1, the second side S2, the third side S3 and the fourth side S4 of the pixel P may be a diagonal line having an inclination greater than 30 and less than 60 with respect to the second signal line SL2.

Meanwhile, each of the first side S1, the second side S2, the third side S3 and the fourth side S4 of the pixel P may include sides of each of at least two of the subpixels P1, P2, P3 and P4.

Each of the plurality of subpixels P1, P2, P3 and P4 may include at least two sides facing the transmissive area TA. For example, each of the plurality of subpixels P1, P2, P3 and P4 may have a shape such as a pixel P, for example, a rhombus shape.

In this case, each of the plurality of subpixels P1, P2, P3 and P4 may include two sides facing the transmissive area TA. The first subpixel P1 may include a first side S11 and a second side S12, which are disposed to be adjacent to the transmissive area TA, the second subpixel P2 may include a first side S21 and a second side S22, which are disposed to be adjacent to the transmissive area TA, the third subpixel P3 may include a first side S31 and a second side S32, which are disposed to be adjacent to the transmissive area TA, and the fourth subpixel P4 may include a first side S41 and a second side S42, which are disposed to be adjacent to the transmissive area TA.

The first side S1 of the pixel P may include the first side S11 of the first subpixel P1 and the second side S22 of the second subpixel P2, and the second side S2 of the pixel P may include the second side S12 of the first pixel P1 and the first side S41 of the fourth subpixel P4. The third side S3 of the pixel P may include the second side S42 of the fourth subpixel P4 and the first side S31 of the third subpixel P3, and the fourth side S4 of the pixel P may include the second side S32 of the third subpixel P3 and the first side S21 of the second subpixel P2.

As a result, the first sides S11, S21, S31 and S41 and the second sides S12, S22, S32 and S42 of each of the plurality of subpixels P1, P2, P3 and P4 may have an inclination with respect to each of the first signal line SL1 and the second signal line SL2, like the plurality of sides S1, S2, S3 and S4 of the pixel P.

The first subpixel P1 and the third subpixel P3 may be provided to overlap at least a portion of the first signal line SL1 and alternately disposed along the first signal line SL1.

The second subpixel P2 and the fourth subpixel P4 may be provided to overlap at least a portion of the second signal line SL2, and may be alternately disposed along the second signal line SL2.

Each of the first subpixel P1, the second subpixel P2, the third subpixel P3 and the fourth subpixel P4 may include a circuit element including a capacitor, a thin film transistor, and the like, and a light emitting element. The thin film transistor may include a switching transistor, a sensing transistor, and a driving transistor.

The switching transistor is switched in accordance with a scan signal supplied to a scan line to supply a data voltage supplied from a data line, to the driving transistor.

The sensing transistor serves to sense deviation in a threshold voltage of the driving transistor, which causes deterioration of image quality.

The driving transistor is switched in accordance with the data voltage supplied from the switching thin film transistor, generates a data current from a power source supplied from a pixel power line, and serves to supply the data current to a first electrode of a subpixel. The driving transistor includes an active layer, a gate electrode, a source electrode, and a drain electrode.

The capacitor serves to maintain the data voltage supplied to the driving transistor for one frame. The capacitor may include, but is not limited to, two capacitor electrodes. In another embodiment, the capacitor may include three capacitor electrodes.

Figure 7:
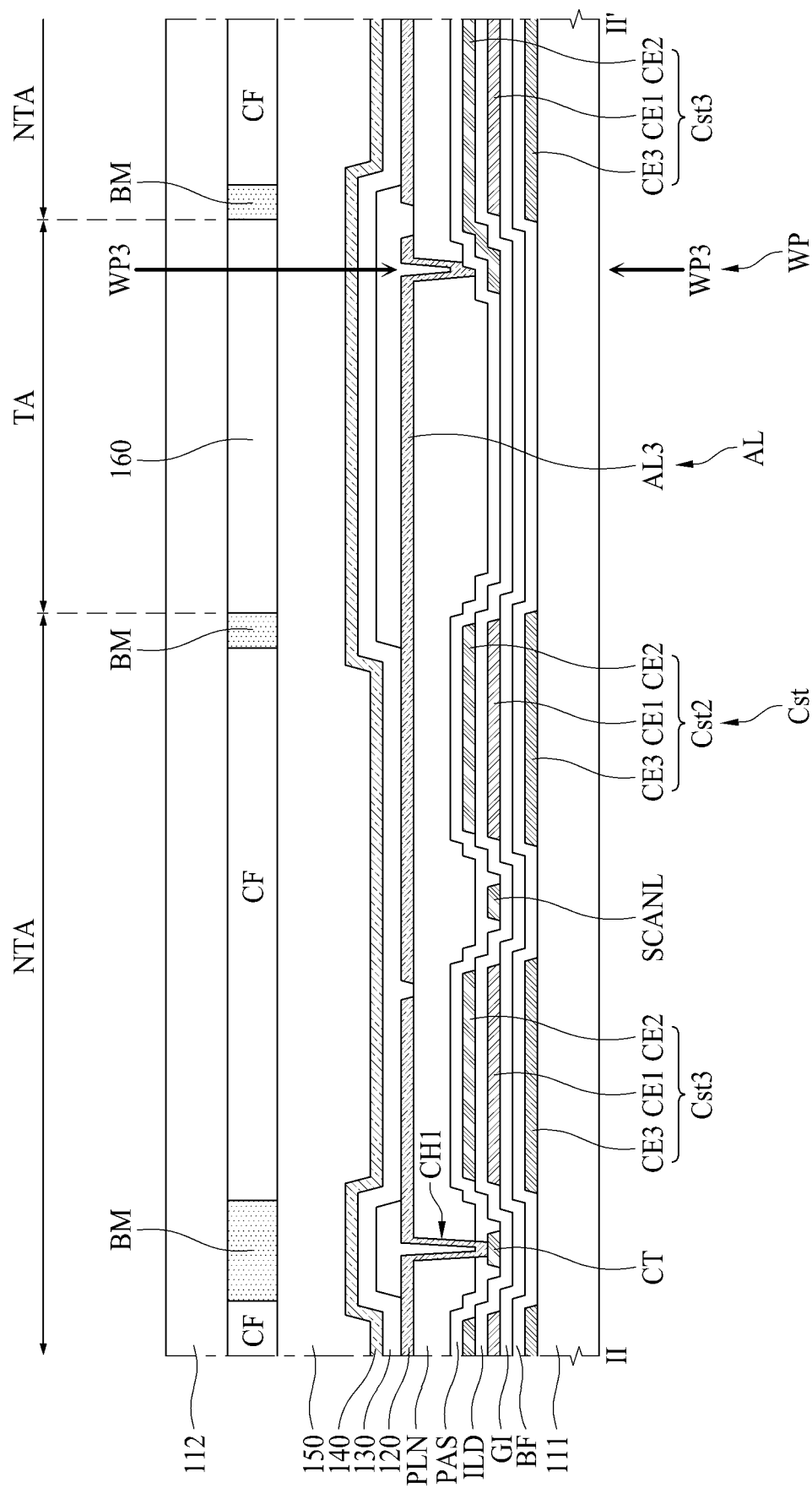
FIG. 7 is a cross-sectional view taken along line II-IP of FIG. 4.
Figure 8:
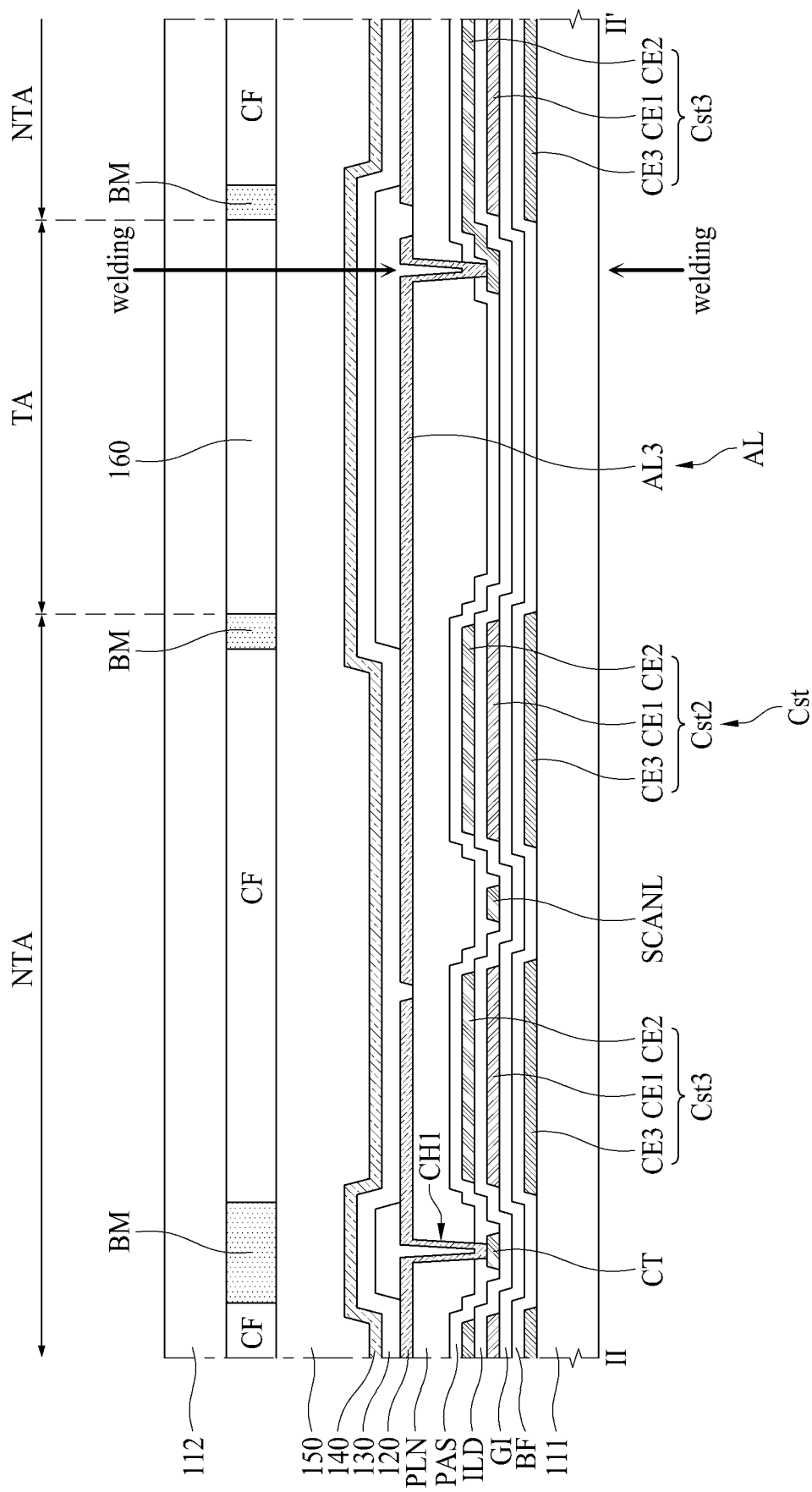
FIG. 8 is a cross-sectional view illustrating a repair process of connecting a defective subpixel with a subpixel disposed to be adjacent thereto.

In the transparent display panel 110 according to one embodiment of the present disclosure, an anode line AL is provided between subpixels of the same color, which are adjacent to each other with the transmissive area TA interposed therebetween, and a welding point may be provided at an end of the anode line AL. The anode line AL may include a first anode line AL1, a second anode line AL2, a third anode line AL3, and a fourth anode line AL4. In some embodiments, the welding point includes a V-shape, or a trench-like shape, or valley shape. FIGS. 7 and 8 provides example shapes of the welding point.

In detail, the first anode line AL1 may be extended from the first electrode of one of the first subpixels P1 adjacent to each other to at least partially overlap the circuit area of the other first subpixel P1. The first anode line AL1 may be provided with a first welding point WP1 provided at one end thereof.

The second anode line AL2 may be extended from the first electrode of one of the second subpixels P2 adjacent to each other to at least partially overlap the circuit area of the other second subpixel P2. The second anode line AL2 may be provided with a second welding point WP2 provided at one end thereof.

The third anode line AL3 may be extended from the first electrode of one of the third subpixels P3 adjacent to each other to at least partially overlap the circuit area of the other third subpixel P3. The third anode line AL3 may be provided with a third welding point WP3 provided at one end thereof.

The fourth anode line AL4 may be extended from the first electrode of one of the fourth subpixels P4 adjacent to each other to at least partially overlap the circuit area of the other fourth subpixel P4. The fourth anode line AL4 may be provided with a fourth welding point WP4 provided at one end thereof.

In some embodiments, the pixel P includes a plurality of subpixels. Namely, the first subpixel P1, the second subpixel P2, the third subpixel P3, the fourth subpixel P4. These subpixels are disposed to overlap either the first signal line SL1 or the second signal line SL2. For example, as shown in FIG. 3, the first subpixel P1 which has two pieces to it (EA1-1, EA1-2), overlaps with the first signal line SL1 but not with the second signal line SL2 from the top view. On other hand, the second subpixel P2 which also has two pieces to it (EA2-1, EA2-2), overlaps with the second signal line SL2 but not with the first signal line SL1 from the top view or the plan view as shown in FIG. 3.

As shown, each subpixel of the plurality of subpixels have a side facing the transmissive area. For example, the second subpixel P2 has a first side SD1 (see the side of EA2-2 in FIG. 3) and the third subpixel P3 has a second side SD2. Both first side SD1 and second SD2 faces the transmissive area TA.

In addition, each side of the subpixel SD1, SD2 facing a same transmissive area TA has a same curvature. A curvature is the amount by which a curve deviates from being a straight line, or a surface deviates from being a plane. For example, the curvature of a circle is equal to the reciprocal of its radius. The curvature of a straight line is zero.

Each side of the second subpixel P2 and the third subpixel P3 has a same curvature. In this case, the curvature is zero because the first side SD1 and the second side SD 2 is a straight line. Further, the transmissive area TA facing the side of each subpixel (e.g., SD1, SD2) have a corresponding curvature according to the curvature of the side of each subpixel (e.g., SD1, SD2). Hereinafter, the capacitor, the driving transistor, the anode line, the plurality of signal lines, and the light emitting element will be described in detail with reference to FIGS. 4 to 8.

Figure 4:
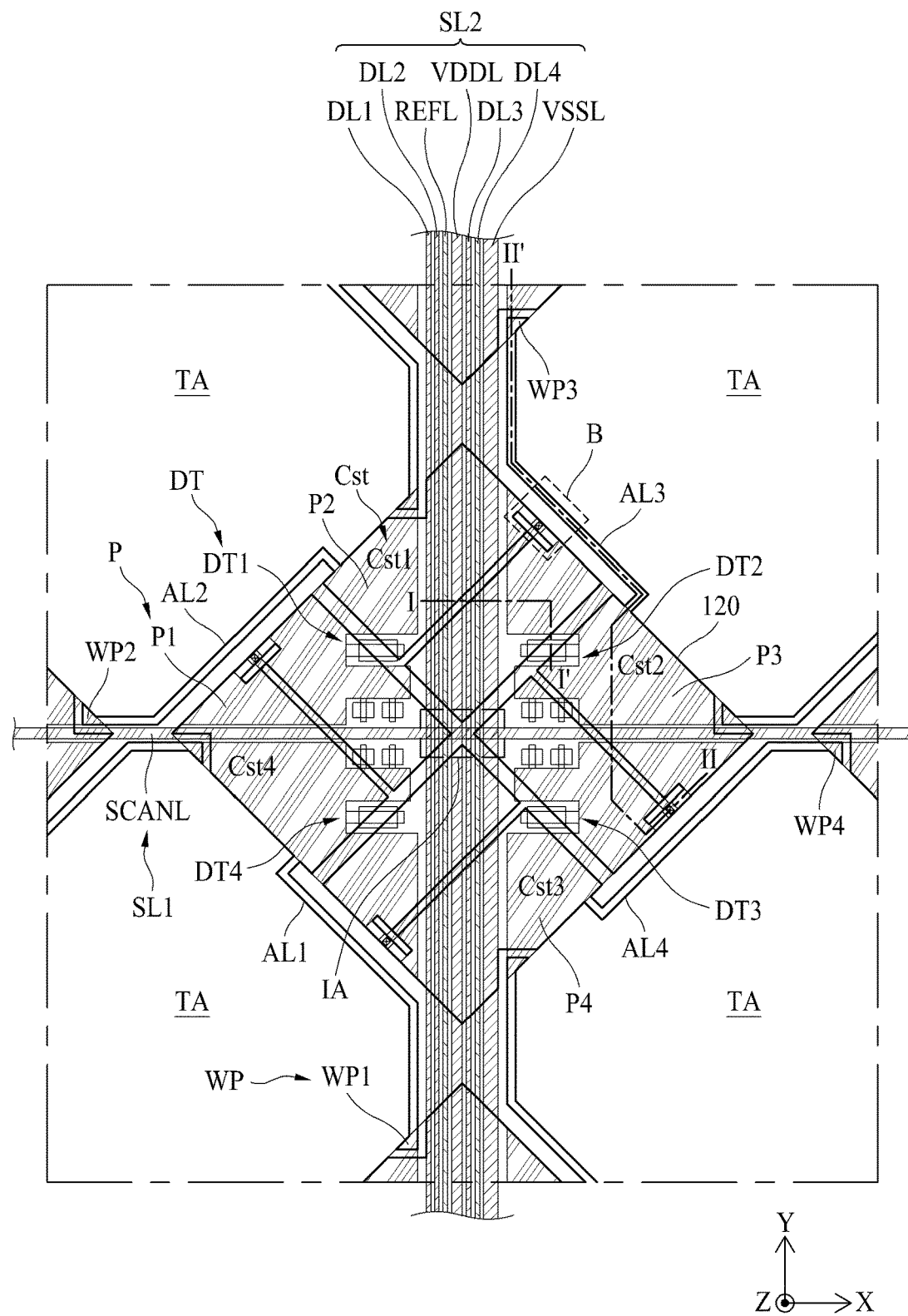
FIG. 4 is a schematic view illustrating a capacitor, a driving transistor, a first electrode, and an anode line, which are provided in a pixel of FIG. 3.
Figure 5:
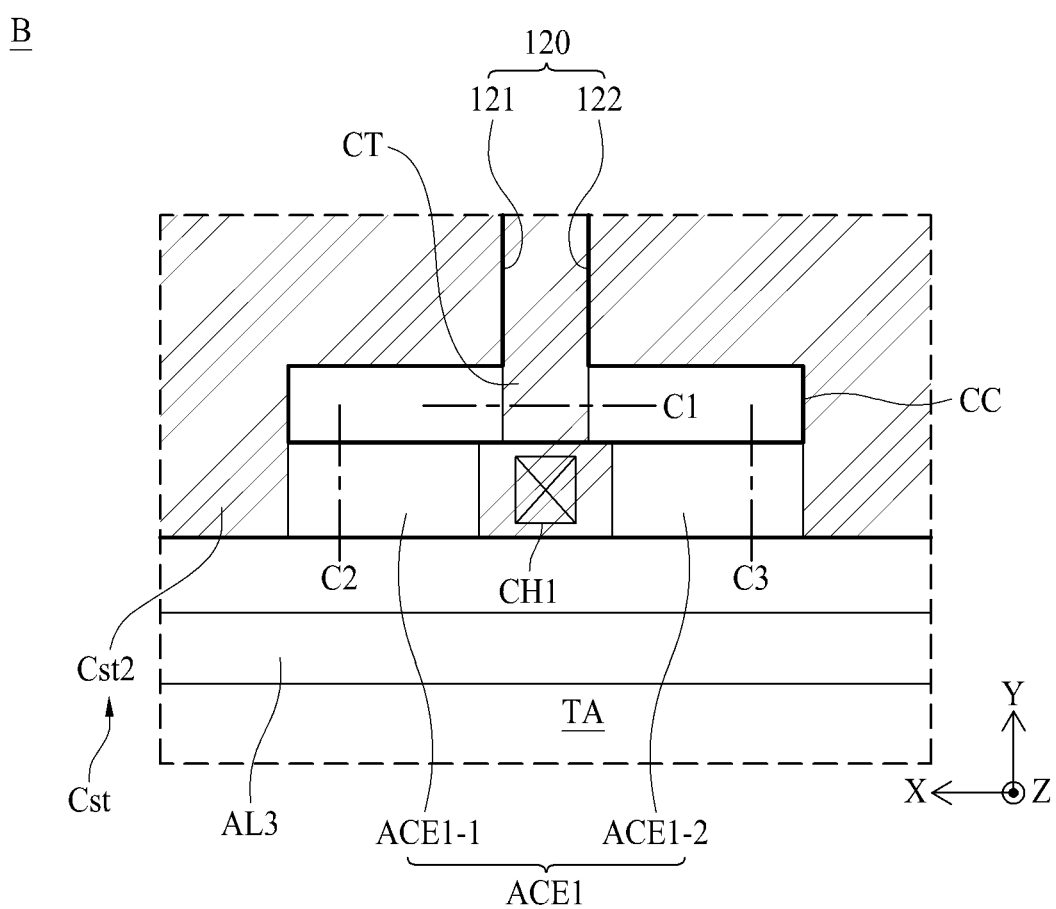
FIG. 5 is an enlarged view illustrating an area B of FIG. 4.
Figure 6:
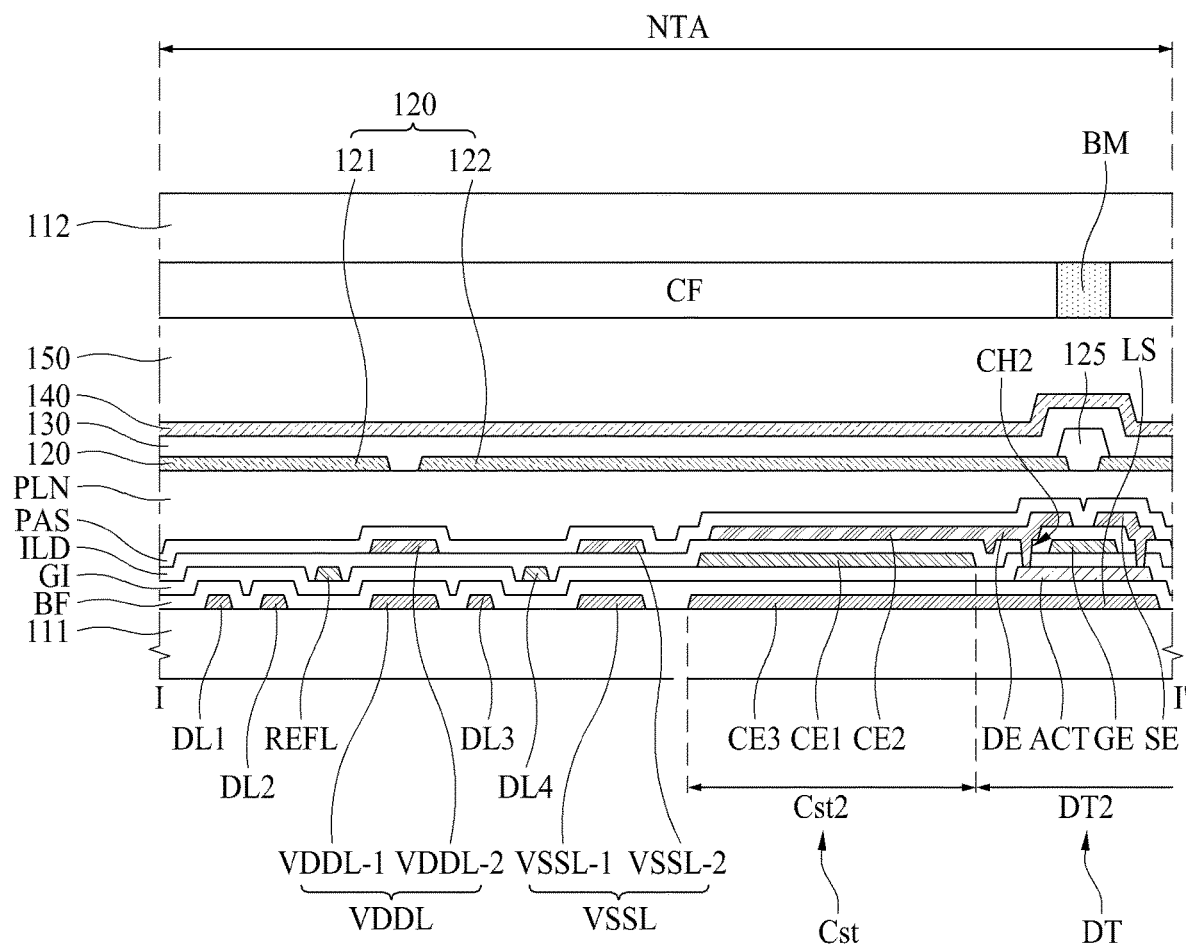
FIG. 6 is a cross-sectional view taken along line I-I' of FIG. 4.

FIG. 4 is a schematic view illustrating a capacitor, a driving transistor, a first electrode and an anode line, which are provided in a pixel of FIG. 3, and FIG. 5 is an enlarged view illustrating an area B of FIG. 4. FIG. 6 is a cross-sectional view taken along line I-I' of FIG. 4, FIG. 7 is a cross-sectional view taken along line II-IP of FIG. 4, and FIG. 8 is a cross-sectional view illustrating a repair process of connecting a defective subpixel with a subpixel disposed to be adjacent thereto.

Referring to FIGS. 4 to 8, as an example, the first signal line SL1 extended in a first direction (e.g., X-axis direction) may be disposed in the non-transmissive area NTA, and may include, but is not limited to, a scan line SCANL. As another example, the first signal line SL1 may include a plurality of scan lines SCANL, for example, two scan lines SCANL.

For example, the second signal line SL2 extended in a second direction (e.g., Y-axis direction) may be disposed in the non-transmissive area NTA, and may include, but is not limited to, a first data line DL1, a second data line DL2, a pixel power line VDDL, a reference line REFL, a common power line VSSL, a third data line DL3, and a fourth data line DL4. As another example, the second signal line SL2 may only include two data lines, a pixel power line VDDL, a reference line REFL, and a common power line VSSL.

The scan line SCANL may supply a scan signal to the subpixels P1, P2, P3 and P4 provided in the display area DA.

The reference line REFL may supply a reference voltage (or an initialization voltage or a sensing voltage) to a driving transistor DT of each of the subpixels P1, P2, P3 and P4 provided in the display area DA.

Each of the first through fourth data lines DL1, DL2, DL3 and DL4 may supply a data voltage to at least one of the subpixels P1, P2, P3 and P4 provided in the display area DA. For example, the first data line DL1 may supply a first data voltage to a first driving transistor DT1 of the first subpixel P1, the second data line DL2 may supply a second data voltage to a second driving transistor DT2 of the second subpixel P2, the third data line DL3 may supply a third data voltage to a third driving transistor DT3 of the third subpixel P3, and the fourth data line DL4 may supply a fourth data voltage to a fourth driving transistor DT4 of the fourth subpixel P4.

The pixel power line VDDL may supply a first power source to the first electrodes 120 of each of the subpixels P1, P2, P3 and P4. The common power line VSSL may supply a second power source to the second electrodes 140 of each of the subpixels P1, P2, P3 and P4.

When the second signal line SL2 includes the pixel power line VDDL and the common power line VSSL, the pixel power line VDDL and the common power line VSSL may have a wide area wider than the other signal lines because a higher voltage is applied thereto. In order to make sure of a wide area, each of the pixel power line VDDL and the common power line VSSL may be formed as a double layer. For example, the pixel power line VDDL may include a first pixel power line VDDL-1 and a second pixel power line VDDL-2, as shown in FIG. 6. Also, the common power line VSSL may include a first common power line VSSL-1 and a second common power line VSSL-2, as shown in FIG. 6.

The transmissive area TA may be disposed between adjacent first signal lines SL1 and between adjacent second signal lines SL2.

Each of the plurality of subpixels P1, P2, P3 and P4 may be disposed in the non-transmissive area NTA to overlap at least one of the first signal line SL1 or the second signal line SL2. For example, the first subpixel P1 and the third subpixel P3 may be provided to overlap at least a portion of the first signal line SL1 and alternately disposed along the first signal line SL1. The second subpixel P2 and the fourth subpixel P4 may be provided to overlap at least a portion of the second signal line SL2 and alternately disposed along the second signal line SL2. Each of the plurality of subpixels P1, P2, P3 and P4 may be provided with a light emitting element.

The driving transistor DT and the capacitor Cst may be disposed between the transmissive area TA and the first signal line SL1 or between the transmissive area TA and the second signal line SL2, and may be connected with the light emitting element of each of the plurality of subpixels P1, P2, P3 and P4.

The driving transistor DT includes an active layer ACT, a gate electrode GE, a source electrode SE, and a drain electrode DE. The capacitor Cst may include, but is not limited to, a first capacitor electrode CE1, a second capacitor electrode CE2, and a third capacitor electrode CE3. In another embodiment, the capacitor Cst may include only two of the first capacitor electrode CE1, the second capacitor electrode CE2, and the third capacitor electrode CE3.

In detail, the active layer ACT may be provided over the first substrate 111. The active layer ACT may be formed of a silicon based semiconductor material or an oxide based semiconductor material.

A light-shielding layer LS may be provided between the active layer ACT and the first substrate 111. The light-shielding layer LS may serve as a light shielding layer for shielding external light entering the active layer ACT. The light-shielding layer LS may be made of a conductive material. For example, the light-shielding layer LS may be formed of a single layer or a multi-layer made of any one of Mo, Al, Cr, Au, Ti, Ni, Nd and Cu, or their alloy. In this case, a buffer layer BF may be provided between the light-shielding layer LS and the active layer ACT.

The third capacitor electrode CE3 and at least one of the plurality of signal lines may be provided on the same layer as the light shielding layer LS. For example, the third capacitor electrode CE3, the first data line DL1, the second data line DL2, the first pixel power line VDDL-1, the third data line DL3, and the first common power line VSSL-1 may be formed of the same material as that of the light shielding layer LS on the same layer as the light shielding layer LS.

A gate insulating layer GI may be provided over the active layer ACT. The gate insulating layer GI may be formed of an inorganic film, for example, a silicon oxide film (SiOx), a silicon nitride film (SiNx) or a multi-layered film of SiOx and SiNx.

The gate electrode GE may be provided over the gate insulating layer GI. The gate electrode GE may be formed of a single layer or a multi-layer made of any one of Mo, Al, Cr, Au, Ti, Ni, Nd and Cu, or their alloy.

In addition, the first capacitor electrode CE1 and at least one of the plurality of signal lines may be provided on the same layer as the gate electrode GE. For example, the first capacitor electrode CE1, the reference line REFL, and the fourth data line DL4 may be formed of the same material as that of the gate electrode GE on the same layer as the gate electrode GE.

FIG. 6 shows that the reference line REFL and the fourth data line DL4 are provided on the same layer as the gate electrode GE, and the first data line DL1, the second data line DL2, the first pixel power line VDDL-1, the third data line DL3, and the first common power line VSSL-1 are provided on the same layer as the light shielding layer LS, but are not limited thereto. Each of the first data line DL1, the second data line DL2, the reference line REFL, the first pixel power line VDDL-1, the first common power line VSSL-1, the third data line DL3, and the fourth data line DL4 may be provided on the same layer as any one of the light shielding layer LS, the active layer ACT, the gate electrode GE, the source electrode SE, and the drain electrode DE.

In the transparent display panel 110 according to one embodiment of the present disclosure, in order to reduce or minimize the width of the second signal line SL2, the plurality of signal lines included in the second signal line SL2 may not be formed in one layer, and may be distributed to the plurality of layers as shown in FIG. 6. Therefore, in the transparent display panel 110 according to one embodiment of the present disclosure, the width of the second signal line SL2 may be reduced or minimized and at the same time parasitic capacitance between adjacent signal lines may be reduced or minimized.

Meanwhile, in the transparent display panel 110 according to one embodiment of the present disclosure, a signal line disposed at the outermost portion among the plurality of signal lines included in the second signal line SL2 may be provided on the same layer as the light shielding layer LS. For example, when the first data line DL1 among the plurality of signal lines included in the second signal line SL2 is disposed at the outermost portion thereof, the first data line DL1 may be provided on the same layer as the light shielding layer LS.

Particles may occur on the upper surface of the signal line during a manufacturing process. When another signal line is deposited on the signal line in which particles occur, with one insulating layer interposed therebetween, a short is likely to occur between the signal line in which particles occur and another signal line. In particular, when a short occurs between the driving transistor DT or the capacitor Cst and the signal line, a problem may occur in that a subpixel connected with the driving transistor DT and the capacitor Cst may not emit light.

In the transparent display panel 110 according to one embodiment of the present disclosure, the signal line disposed to be adjacent to the driving transistor DT or the capacitor Cst may be provided over the light shielding layer LS in order to prevent a short from occurring between the driving transistor DT or the capacitor Cst and the signal lines due to particles. Since a plurality of insulating layers BF, GI and ILD are provided between the source electrode SE of the driving transistor DT or the second capacitor electrode CE2 of the capacitor Cst and the light shielding layer LS, a short may be prevented from occurring between the signal line provided in the light shielding layer LS and the source electrode SE of the driving transistor DT or the second capacitor electrode CE2 of the capacitor Cst even though particles occur on the upper surface of the signal line.

FIG. 4 and FIG. 6 show that the first data line DL1, the second data line DL2, the reference line REFL, the pixel power line VDDL, the third data line DL3, the fourth data line DL4, and the common power line VSSL are disposed in due order, but are not limited thereto. The arrangement order of the signal lines included in the second signal line SL2 may be changed in various ways.

An inter-layer dielectric layer ILD may be provided over the gate electrode GE. The inter-layer dielectric layer ILD may be made of an inorganic film, for example, a silicon oxide film (SiOx), a silicon nitride film (SiNx) or a multi-layered film of SiOx and SiNx.

The source electrode SE and the drain electrode DE may be provided over the inter-layer dielectric layer ILD. The source electrode SE and the drain electrode DE may be connected to the active layer ACT through a contact hole passing through the gate insulating layer GI and the inter-layer dielectric layer ILD.

The source electrode SE and the drain electrode DE may be made of a single layer or a multi-layer of any one of Mo, Al, Cr, Au, Ti, Ni, Nd and Cu, or their alloy.

In addition, the second capacitor electrode CE2 and at least one of the plurality of signal lines may be provided on the same layer as the source electrode SE and the drain electrode DE. For example, the second capacitor electrode CE2, the second pixel power line VDDL-2, and the second common power line VSSL-2 may be formed of the same material as that of the source electrode SE and the drain electrode DE on the same layer as the source electrode SE and the drain electrode DE.

In particular, the second capacitor electrode CE2 of the capacitor Cst may be extended from the source electrode SE or the drain electrode DE. Therefore, the second capacitor electrode CE2 of the capacitor Cst may electrically be connected with the source electrode SE or the drain electrode DE of the driving transistor DT.

A passivation layer PAS for protecting the driving transistor TR may be provided over the source electrode SE and the drain electrode DE.

A planarization layer PLN for planarizing a step difference caused by the driving transistor TR may be provided over the passivation layer PAS. The planarization layer PLN may be formed of an organic film such as acryl resin, epoxy resin, phenolic resin, polyamide resin, and polyimide resin.

Hereinafter, an example in which the first signal line SL1, the second signal line SL2, the driving transistor DT, and the capacitor Cst are disposed will be described in more detail.

The driving transistor DT may include a first driving transistor DT1 connected with the first subpixel P1, a second driving transistor DT2 connected with the second subpixel P2, a third driving transistor DT3 connected with the third subpixel P3, and a fourth driving transistor DT4 connected with the fourth subpixel P4.

The capacitor Cst may include a first capacitor Cst1 connected with the first subpixel P1, a second capacitor Cst2 connected with the second subpixel P2, a third capacitor Cst3 connected with the third subpixel P3, and a fourth capacitor Cst4 connected with the fourth subpixel P4.

The first driving transistor DT1 may be disposed over the first side of the first signal line SL1 and the first side of the second signal line SL2, and may be provided between the transmissive area TA and the overlapping area IA. The first driving transistor DT1 may be switched in accordance with the data voltage charged in the first capacitor Cst1 to supply the power source supplied from the pixel power line VDDL to the first electrode 120 of the first subpixel P1.

The first capacitor Cst1 may be provided between the transmissive area TA and the first driving transistor DT1, and may be connected with the first driving transistor DT1. The first capacitor electrode CE1 of the first capacitor Cst1 may be extended from the gate electrode GE of the first driving transistor DT1. The second capacitor electrode CE2 of the first capacitor Cst1 may be provided to be extended from the source electrode SE or the drain electrode DE of the first driving transistor DT1.

The first capacitor Cst1 may electrically be connected with the first electrode 120 of the first subpixel P1 through the contact electrode CT. The first driving transistor DT1 may electrically be connected with the first electrode 120 of the first subpixel P1 through the first capacitor Cst1.

The second driving transistor DT2 may be disposed to be symmetrical with the first driving transistor DT1 based on the second signal line SL2. The second driving transistor DT2 may be switched in accordance with the data voltage charged in the second capacitor Cst2 to supply the power source supplied from the pixel power line VDDL to the first electrode 120 of the second subpixel P2.

The second capacitor Cst2 may be provided between the transmissive area TA and the second driving transistor DT2. At this time, the second capacitor Cst2 may be disposed to be symmetrical with the first capacitor Cst1 based on the second signal line SL2. The second capacitor Cst2 may be connected with the second driving transistor DT2. In detail, the first capacitor electrode CE1 of the second capacitor Cst2 may be provided to be extended from the gate electrode GE of the second driving transistor DT2. The second capacitor electrode CE2 of the second capacitor Cst2 may be provided to be extended from the source electrode SE or the drain electrode DE of the second driving transistor DT2.

The second capacitor Cst2 may electrically be connected with the first electrode 120 of the second subpixel P2 through the contact electrode CT. The second driving transistor DT2 may electrically be connected with the first electrode 120 of the second subpixel P2 through the second capacitor Cst2.

The third driving transistor DT3 may be disposed to be symmetrical with the second driving transistor DT2 based on the first signal line SL1. The third driving transistor DT3 may be switched in accordance with the data voltage charged in the third capacitor Cst3 to supply the power source supplied from the pixel power line VDDL to the first electrode 120 of the third subpixel P3.

The third capacitor Cst3 may be disposed between the transmissive area TA and the third driving transistor DT3. At this time, the third capacitor Cst3 may be disposed to be symmetrical with the second capacitor Cst2 based on the first signal line SL1. The third capacitor Cst3 may be connected with the third driving transistor DT3. In detail, the first capacitor electrode CE1 of the third capacitor Cst3 may be provided to be extended from the gate electrode GE of the third driving transistor DT3. The second capacitor electrode CE2 of the third capacitor Cst3 may be provided to be extended from the source electrode SE or the drain electrode DE of the third driving transistor DT3.

The third capacitor Cst3 may electrically be connected with the first electrode 120 of the third subpixel P3 through the contact electrode CT. The third driving transistor DT3 may electrically be connected with the first electrode 120 of the third subpixel P3 through the third capacitor Cst3.

The fourth driving transistor DT4 may be disposed to be symmetrical with the third driving transistor DT3 based on the second signal line SL2. The fourth driving transistor DT4 may be switched in accordance with the data voltage charged in the fourth capacitor Cst4 to supply the power source supplied from the pixel power line VDDL to the first electrode 120 of the fourth subpixel P4.

The fourth capacitor Cst4 may be provided between the transmissive area TA and the fourth driving transistor DT4. At this time, the fourth capacitor Cst4 may be disposed to be symmetrical with the third capacitor Cst3 based on the second signal line SL2. The fourth capacitor Cst4 may be connected with the fourth driving transistor DT4. In detail, the first capacitor electrode CE1 of the fourth capacitor Cst4 may be provided to be extended from the gate electrode GE of the fourth driving transistor DT4. The second capacitor electrode CE2 of the fourth capacitor Cst4 may be provided to be extended from the source electrode SE or the drain electrode DE of the fourth driving transistor DT4.

The fourth capacitor Cst4 may electrically be connected with the first electrode 120 of the fourth subpixel P4 through the contact electrode CT. The fourth driving transistor DT4 may electrically be connected with the first electrode 120 of the fourth subpixel P4 through the fourth capacitor Cst4.

In the transparent display panel 110 according to one embodiment of the present disclosure, the driving transistor DT and the capacitor Cst may be disposed so as not to overlap the first signal line SL1 and the second signal line SL2. Therefore, in the transparent display panel 110 according to one embodiment of the present disclosure, a parasitic cap may be prevented from occurring between the signal lines SL1 and SL2 and the driving transistor DT or the capacitor Cst.

In addition, in the transparent display panel 110 according to one embodiment of the present disclosure, the driving transistor DT may be disposed to be closer to the overlapping area IA than the capacitor Cst. The driving transistor DT may be connected with a connection line diverged from at least one of the first signal line SL1 or the second signal line SL2. In the transparent display panel 110 according to one embodiment of the present disclosure, the driving transistor DT is disposed to be close to the overlapping area IA, whereby a length of the connection line for connecting the driving transistor DT with the signal lines SL1 and SL2 may be reduced or minimized. Therefore, in the transparent display panel 110 according to one embodiment of the present disclosure, loss of the voltage transferred from the first signal line SL1 or the second signal line SL2, which is caused by resistance, may be reduced or minimized.

Meanwhile, in the transparent display panel 110 according to one embodiment of the present disclosure, the capacitor Cst may be disposed between the driving transistor DT and the transmissive area TA. In this case, a shape of the transmissive area TA may be determined by the capacitor Cst.

At least one side of the capacitor Cst, which faces the transmissive area TA, may have the same shape as that of the pixel P. In more detail, at least one side of the capacitor Cst, which faces the transmissive area TA, may have an inclination with respect to each of the first signal line SL1 and the second signal line SL2.

The capacitor Cst may include one first side CS1 facing the transmissive area TA.

The first side CS1 of the capacitor Cst may have an inclination without being parallel with or perpendicular to the first signal line SL1. That is, the first side CS1 of the capacitor Cst may have an inclination greater than 0 and less than 90 with respect to the first signal line SL1. For example, the first side CS1 of the capacitor Cst may be comprised of a straight line having an inclination greater than 30 and less than 60 with respect to the first signal line SL1.

In addition, the first side CS1 of the capacitor Cst may have an inclination without being parallel with or perpendicular to the second signal line SL2. That is, the first side CS1 of the capacitor Cst may have an inclination greater than 0 and less than 90 with respect to the second signal line SL2. For example, the first side CS1 of the capacitor Cst may be comprised of a straight line having an inclination greater than 30 and less than 60 with respect to the second signal line SL2.

The capacitor Cst may be provided to have a maximum wide area in the pixel P. Accordingly, in some embodiments, in the transparent display panel 110 according to one embodiment of the present disclosure, the shape of the side of the first side CS1 of the capacitor Cst may be the same as that of a side facing the transmissive area TA of the subpixels P1, P2, P3 and P4. Further, in the transparent display panel 110 according to one embodiment of the present disclosure, an end of the first side CS1 of the capacitor Cst may be the same as an end of a side facing the transmissive area TA of the subpixels P1, P2, P3 and P4. In one embodiment, the end of the first side CS1 of the capacitor Cst, which faces the transmissive area TA, may be the same as the first electrode 120.

The transparent display panel 110 according to one embodiment of the present disclosure may make sure of a maximum capacity of the capacitor Cst, and may improve luminance.

In addition, in the transparent display panel 110 according to one embodiment of the present disclosure, the shape of the transmission area TA may freely be changed depending on the shape of the first side CS1 of the capacitor Cst, whereby the degree of freedom in design of the transmissive area TA may be ensured without loss of transmittance.

Referring back to FIG. 6 and FIG. 7, light emitting diodes including the first electrode 120, the organic light emitting layer 130 and the second electrode 140, and a bank 125 are provided over a planarization layer PLN.

The first electrode 120 may be provided over a planarization layer PLN and connected with the driving transistor DT. The first electrode 120 may be provided for each of the subpixels P1, P2, P3 and P4. One first electrode 120 may be provided in the first subpixel P1, another first electrode 120 may be provided in the second subpixel P2, the other first electrode 120 may be provide in the third subpixel P3, and the other first electrode 120 may be provided in the fourth subpixel P4. The first electrode 120 is not provided in the transmissive area TA.

The first electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti). The first electrode 120 may be anode electrode.

The first electrodes 120 provided in each of the plurality of subpixels P1, P2, P3 and P4 may be provide in a plural number. For example, the first electrode 120 provided in each of the plurality of subpixels P1, P2, P3 and P4 may include a first divided electrode 121, a second divided electrode 122, and a connection electrode ACE1.

The first divided electrode 121 may be disposed over the first divided light emission areas EA1-1, EA2-1, EA3-1 and EA4-1, and the second divided electrode 122 may be disposed over the second divided light emission areas EA1-2, EA2-2, EA3-2 and EA4-2.

The first divided electrode 121 and the second divided electrode 122 may be spaced apart from each other on the same layer. In detail, the first and second divided electrodes 121 and 122 respectively provided in the first subpixel P1 and the third subpixel P3 may be spaced apart from each other on the first signal line SL1 in a third direction. The first and second divided electrodes 121 and 122 respectively provided in the second subpixel P2 and the fourth subpixel P4 may be spaced apart from each other on the second signal line SL2 in a fourth direction.

The connection electrode ACE1 may connect the first divided electrode 121 and the second divided electrode 122, which are spaced apart from each other, with each other in a straight line. In detail, the connection electrode ACE1 may not be provided toward the transmissive area TA, and may have one end connected with the first divided electrode 121 and the other end connected with the second divided electrode 122 to constitute a straight line. In addition, a boundary between the connection electrode ACE1 and the transmissive area TA may form a straight line with a boundary between the first divided electrode 121 and the transmissive area TA and a boundary between the second divided electrode 122 and the transmissive area TA.

The connection electrode ACE1 may include a first connection portion ACE1-1 and a second connection portion ACE1-2. The first connection portion ACE1-1 may be connected with the first divided electrode 121 and extended from the first divided electrode 121 toward the second divided electrode 122 as much as a predetermined length (or in some embodiments, a selected length). The second connection portion ACE1-2 may be connected with the second divided electrode 122 and extended from the second divided electrode 122 toward the first divided electrode 121 as much as a predetermined length (or in some embodiments, a selected length). The first connection portion ACE1-1 and the second connection portion ACE1-2 may be connected with each other in a straight line. Therefore, the first divided electrode 121 may electrically be connected with the second divided electrode 122 through the connection electrode ACE1.

The first connection portion ACE1-1 and the second connection portion ACE1-2 may be provided on the same layer as the first divided electrode 121 and the second divided electrode 122. In addition, the first connection portion ACE1-1 and the second connection portion ACE1-2 may integrally be provided with the first divided electrode 121 and the second divided electrode 122. The first electrode 120 may electrically be connected with the source electrode SE or the drain electrode DE of the driving transistor DT through the second capacitor electrode CE2 of the capacitor Cst.

In detail, the first electrode 120 may electrically be connected with the second capacitor electrode CE2 of the capacitor Cst through the contact electrode CT. In more detail, the plurality of capacitors Cst may include a concave portion CC that forms a concave area in a direction from the transmissive area TA toward the overlapping area IA.

The contact electrode CT may be protruded from the concave portion CC of the capacitor Cst toward the transmissive area TA. At this time, the contact electrode CT may be protruded from the second capacitor electrode CE2 provided in the capacitor Cst. The contact electrode CT may overlap at least a portion of the connection electrode ACE1 at the end.

The connection electrode ACE1 may be connected with the contact electrode CT through a first contact hole CH1 in an area overlapped with the contact electrode CT. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the connection electrode ACE1, the contact electrode CT, and the second capacitor electrode CE2 of the capacitor Cst.

In the transparent display panel 110 according to one embodiment of the present disclosure, a defect may occur in the driving transistor DT. When a defect occurs in the driving transistor DT, the driving transistor DT of the corresponding subpixel may electrically be separated from the first electrode 120. That is, the first electrode 120 of the subpixel having a defect is not connected with the driving transistor DT.

In detail, in the transparent display panel 110 according to another embodiment of the present disclosure, a second cutting area C2 and a third cutting area C3 may be provided in the connection electrode ACE1. In detail, the connection electrode ACE1 may include the second cutting area C2 between the first contact hole CH1 and the first divided electrode 121, and the third cutting area C3 between the first contact hole CH1 and the second divided electrode 122.

In the transparent display panel 110 according to one embodiment of the present disclosure, when any one of the first divided electrode 121 and the second divided electrode 122 operates in error due to particles that may occur during the process, the transparent display panel 110 may be repaired by laser cutting for at least one of the first connection portion ACE1-1 or the second connection portion ACE1-2 of the connection electrode ACE1.

As an example, when a short occurs between the first electrode 120 and the second electrode 140 by particles in an area in which the first divided electrode 121 is provided, the transparent display panel 110 may be repaired by laser cutting for the second cutting area C2 of the first connection portion ACE1-1.

As another example, when a short occurs between the first electrode 120 and the second electrode 140 due to particles in an area in which the second divided electrode 122 is provided, the transparent display panel 110 can be repaired by laser cutting for a third cutting area C3 of the second connection portion ACE1-2.

In the transparent display panel 110 according to one embodiment of the present disclosure, only the corresponding divided electrodes among the plurality of divided electrodes 121 and 122 may be open-circuited through laser cutting even though a dark spot occurs by the particles, whereby a light loss rate due to occurrence of the dark spot may be reduced.

In addition, in the transparent display panel 110 according to one embodiment of the present disclosure, a first cutting area C1 may be provided in the contact electrode CT. In detail, the contact electrode CT may include the first cutting area C1 between the first contact hole CH1 and the capacitor pattern portion.

When a defect occurs in the driving transistor DT of a portion of the plurality of subpixels, the first cutting area C1 of the contact electrode CT connected with the first electrode 120 of the corresponding subpixel may be cut by a laser, whereby the driving transistor DT having a defect may electrically be separated from the first electrode 120. Therefore, a signal applied from the driving transistor DT may be blocked from being applied to the subpixel having a defect occurring in the driving transistor DT, whereby the corresponding subpixel may not emit light.

Meanwhile, in the transparent display panel 110 according to one embodiment of the present disclosure, a signal of a subpixel, which has the same color as that of a defective subpixel and is adjacent to the defective subpixel, may be applied to the defective subpixel through the anode line AL.

In detail, in the transparent display panel 110 according to one embodiment of the present disclosure, the anode line AL may be provided over at least one side of the transmissive area TA. The anode line AL may be extended from the first electrode 120 of each of the plurality of subpixels P1, P2, P3 and P4 and at least a portion thereof may overlap the driving transistor DT or the capacitor Cst of another adjacent subpixel having the same color. The anode line AL may include a first anode line AL1, a second anode line AL2, a third anode line AL3, and a fourth anode line AL4.

The first anode line AL1 may be provided between two first subpixels P1 adjacent to each other with the transmissive area TA interposed therebetween. The first anode line AL1 may be protruded from the first electrode 120 of one of the two first subpixels P1 that are adjacent to each other with the transmissive area TA interposed therebetween, and may be extended toward the other first subpixel P1. At this time, the first anode line AL1 may be extended along an outer portion of the transmissive area TA.

The first subpixels P1 may be disposed to be adjacent to each other in the second direction with the transmissive area TA interposed therebetween. In this case, the first anode line AL1 may be extended from the first electrode 120 of each of the first subpixels P1, and at least a portion thereof may overlap the first driving transistor DT1 or the first capacitor Cst1 of the first subpixel P1 adjacent thereto in the second direction.

For example, the first electrode 120 of the first subpixel P1 may include a first side S11 and a second side S12, which are disposed to be adjacent to the transmissive area TA, and may be connected to the first capacitor Cst1 on any one of the first side S11 and the second side S12, for example, on the first side S11 through the first contact hole CH1. In this case, the first anode line AL1 may be extended from the other one of the first side S11 and the second side S12 of the first electrode 120 of the first subpixel P1, for example, from the second side S12. That is, the first electrode 120 of the first subpixel P1 may be connected with the first capacitor Cst1 at any one of the two sides S11 and S12 disposed to be adjacent to the transmissive area TA, and may be connected with the first anode line AL1 at the other one of the two sides S11 and S12.

The first anode line AL1 may be protruded from the first electrode 120 of each of the first subpixels P1 and extended to the area, in which the first driving transistor DT1 or the first capacitor Cst1 of the first subpixel P1 adjacent thereto in the second direction, along the outer portion of the transmissive area TA. The first capacitor Cst1 may be disposed to be closer to the transmissive area TA than the first driving transistor DT1. In this case, at least a portion of the first anode line AL1 may overlap the first capacitor Cst1 of the first subpixel P1 adjacent thereto in the second direction, whereby the first welding point WP1 may be provided.

The second anode line AL2 may be provided between two second subpixels P2 adjacent to each other with the transmissive area TA interposed therebetween. The second anode line AL2 may be protruded from the first electrode 120 of one of the two second subpixels P2 adjacent to each other with the transmissive area TA interposed therebetween, and may be extended toward the other second subpixel P2. At this time, the second anode line AL2 may be extended along the outer portion of the transmissive area TA.

The second subpixels P2 may be disposed to be adjacent to each other in the first direction with the transmissive area TA interposed therebetween. In this case, the second anode line AL2 may be extended from the first electrode 120 of each of the second subpixels P2, and at least a portion thereof may overlap the second driving transistor DT2 or the second capacitor Cst2 of the second subpixel P2 adjacent thereto in the second direction.

For example, the first electrode 120 of the second subpixel P2 may include a first side S21 and a second side S22, which are disposed to be adjacent to the transmissive area TA, and may be connected to the second capacitor Cst2 at any one of the first side S21 and the second side S22, for example, at the first side S21, through the first contact hole CH1. In this case, the second anode line AL2 may be extended from the other one of the first side S21 and the second side S22 of the first electrode 120 of the second subpixel P2, for example, from the second side S22. That is, the first electrode 120 of the second subpixel P2 may be connected with the second capacitor Cst2 at one of the two sides S21 and S22 disposed to be adjacent to the transmissive area TA, and may be connected with the second anode line AL2 at the other one of the two sides S21 and S22.

The second anode line AL2 may be protruded from the first electrode 120 of each of the second subpixels P2 and extended to the area in which the second driving transistor DT2 or the second capacitor Cst2 of the second subpixel P2 adjacent thereto in the first direction, along the outer portion of the transmissive area TA. The second capacitor Cst2 may be disposed to be closer to the transmissive area TA than the second driving transistor DT2. In this case, at least a portion of the second anode line AL2 may overlap the second capacitor Cst2 of the second subpixel P2 adjacent thereto in the first direction, whereby the second welding point WP2 may be provided.

The third anode line AL3 may be provided between two third subpixels P3 adjacent to each other with the transmissive area TA interposed therebetween. The third anode line AL3 may be protruded from the first electrode 120 of one of the two third subpixels P3 adjacent to each other with the transmissive area TA interposed therebetween and extended toward the other third subpixel P3. At this time, the third anode line AL3 may be extended along the outer portion of the transmissive area TA.

The third subpixels P3 may be disposed to be adjacent to each other in the second direction with the transmissive area TA interposed therebetween. In this case, the third anode line AL3 may be extended from the first electrode 120 of each of the third subpixels P3, and at least a portion thereof may overlap the third driving transistor DT3 or the third capacitor Cst3 of the third subpixel P3 adjacent thereto in the second direction.

For example, the first electrode 120 of the third subpixel P3 may include a first side S31 and a second side S32, which are disposed to be adjacent to the transmissive area TA, and may be connected to the third capacitor Cst3 at any one of the first side S31 and the second side S32, for example, at the first side S31, through the first contact hole CH1. In this case, the third anode line AL3 may be extended from the other one of the first side S31 and the second side S32 of the first electrode 120 of the third subpixel P3, for example, from the second side S32. That is, the first electrode 120 of the third subpixel P3 may be connected with the third capacitor Cst2 at one of the two sides S31 and S32 disposed to be adjacent to the transmissive area TA, and may be connected with the third anode line AL3 at the other one of the two sides S31 and 32.

The third anode line AL3 may be protruded from the first electrode 120 of each of the third subpixels P3 and extended to the area in which the third driving transistor DT3 or the third capacitor Cst3 of the third subpixel P3 adjacent thereto in the second direction, along the outer portion of the transmissive area TA. The third capacitor Cst3 may be disposed to be closer to the transmissive area TA than the third driving transistor DT3. In this case, at least a portion of the third anode line AL3 may overlap the third capacitor Cst3 of the third subpixel P3 adjacent thereto in the second direction, whereby the third welding point WP3 may be provided.

In some embodiments, the third anode line AL3 is provided on the same layer as the first electrode 120. As shown in FIG. 7, the third anode line AL3 is spaced apart from the first electrode 120.

In some embodiments, the anode line and the first electrode is formed at a same time based on a same process.

Referring back to FIG. 7, the third anode line AL3 includes a welding point WP3 that protrudes downward and contacts the passivation layer PAS. The welding point WP3 may include a V-shape, a valley shape, or a trench-like shape.

This welding point WP3 as shown in FIG. 8, electrically connects to the second capacitor electrode CE2 of the third capacitor Cst3 when a welding process is applied.

The fourth anode line AL4 may be provided between two fourth subpixels P4 adjacent to each other with the transmissive area TA interposed therebetween. The fourth anode line AL4 may be protruded from the first electrode 120 of one of the two fourth subpixels P4 adjacent to each other with the transmissive area TA interposed therebetween and extended toward the other fourth subpixel P4. At this time, the fourth anode line AL4 may be extended along the outer portion of the transmissive area TA.

The fourth subpixels P4 may be disposed to be adjacent to each other in the first direction with the transmissive area TA interposed therebetween. In this case, the fourth anode line AL4 may be extended from the first electrode 120 of each of the fourth subpixels P4, and at least a portion thereof may overlap the fourth driving transistor DT4 or the fourth capacitor Cst4 of the fourth subpixel P4 adjacent thereto in the first direction.

For example, the first electrode 120 of the fourth subpixel P4 may include a first side S41 and a second side S42, which are disposed to be adjacent to the transmissive area TA, and may be connected to the fourth capacitor Cst4 at any one of the first side S41 and the second side S42, for example, at the first side S41, through the first contact hole CH1. In this case, the fourth anode line AL4 may be extended from the other one of the first side S41 and the second side S42 of the first electrode 120 of the fourth subpixel P4, for example, from the second side S42. That is, the first electrode 120 of the fourth subpixel P4 may be connected with the fourth capacitor Cst4 at one of the two sides S41 and S42 disposed to be adjacent to the transmissive area TA, and may be connected with the fourth anode line AL4 at the other one of the two sides S41 and 42.

The fourth anode line AL4 may be protruded from the first electrode 120 of each of the fourth subpixels P4 and extended to the area in which the fourth driving transistor DT4 or the fourth capacitor Cst4 of the fourth subpixel P4 adjacent thereto in the first direction, along the outer portion of the transmissive area TA. The fourth capacitor Cst4 may be disposed to be closer to the transmissive area TA than the fourth driving transistor DT4. In this case, at least a portion of the fourth anode line AL4 may overlap the fourth capacitor Cst4 of the fourth subpixel P4 adjacent thereto in the first direction, whereby the fourth welding point WP4 may be provided.

Each of the first to fourth anode lines AL1, AL2, AL3 and AL4 disposed as above may be connected with the first electrode 120 of the subpixel at one end. Each of the first to fourth anode lines AL1, AL2, AL3 and AL4 may electrically be separated from the driving transistors DT1, DT2, DT3 and DT4 or the capacitors Cst1, Cst2, Cst3 and Cst4 at the welding points WP1, WP2, WP3 and WP4 provided at the other end with at least one insulating layer, for example, a planarization layer PLN and a passivation layer PAS, which are interposed therebetween.

The first through fourth anode lines AL1, AL2, AL3 and AL4 may be provided to be flat on the planarization layer PLN, but as shown in FIG. 7, may have a step difference along a hole provided in the planarization layer PLN at the welding points WP1, WP2, WP3 and WP4. In detail, since a thickness of the planarization layer PLN is relatively thick, the planarization layer PLN may partially be removed at a position corresponding to the welding points WP1, WP2, WP3, and WP4 to form a hole. Therefore, the first to fourth anode lines AL1, AL2, AL3 and AL4 may be spaced apart from the driving transistors DT1, DT2, DT3 and DT4 or the capacitors Cst1, Cst2, Cst3 and Cst4 at the welding points WP1, WP2, WP3 and WP4 with only the passivation layer PAS interposed therebetween.

Therefore, the signal applied to one subpixel may not be applied to the other subpixel adjacent thereto until the repair process is performed. However, when a defect occurs in the driving transistor of one subpixel, the repair process of connecting the subpixel having a defect with a normal subpixel may be performed.

The repair process may include a test process, a cutting process, and a welding process. The test process may detect whether the plurality of subpixels P1, P2, P3 and P4 are defective. The cutting process may cut the area where the subpixel and the driving transistor DT are connected with each other, to block the signal applied from the driving transistor DT from being applied to the subpixel that is determined to be defective. The welding process may electrically connect the normal subpixel adjacent to the defective subpixel with the defective subpixel to apply a signal of the normal subpixel to the defective subpixel.

In more detail, when a defect occurs in the first driving transistor DT1 of one first subpixel P1, the repair process of connecting the first subpixel P1 having a defect with the first subpixel P1 of a normal state may be performed.

The repair process may block a signal applied from the first driving transistor DT1 from being applied to the first subpixel P1 that is determined to be defective, by cutting the first cutting area C1 of the contact electrode CT extended from the first capacitor Cst1 through the cutting process.

The repair process may apply a signal of the normal first subpixel P1, which is adjacent to the defective subpixel, to the defective first subpixel P1 by electrically connecting the normal first subpixel P1 with the defective first subpixel P1 through the welding process. In detail, the welding process may irradiate a laser to the first anode line AL1 of the defective first subpixel P1 and the first capacitor Cst1 of the normal first subpixel P1, specifically the first welding point WP1 overlapped with at least a portion of the second capacitor electrode CE2. Therefore, the first anode line AL1 of the defective first subpixel P1 and the first capacitor Cst1 of the normal first subpixel P1, which are electrically separated from each other, may electrically be connected with each other as shown in FIG. 8.

At this time, the welding process may irradiate a laser to a lower or upper portion of the first anode line AL1. The welding process may be performed before the light emitting layer 130 or the second electrode 140 is deposited. In this case, the laser may be irradiated above the first anode line AL1, whereby the first anode line AL1 of the defective first subpixel P1 and the first capacitor Cst1 of the normal first subpixel P1, which are electrically separated from each other, may electrically be connected with each other. Alternatively, the welding process may be performed after the light emitting layer 130 or the second electrode 140 is deposited, and in this case, the laser may be irradiated to the lower portion of the first anode line AL1, whereby the first anode line AL1 of the defective first subpixel P1 and the first capacitor Cst1 of the normal first subpixel P1, which are electrically separated from each other, may electrically be connected with each other.

Since the first capacitor Cst1 is electrically connected with the first driving transistor DT1, the signal applied to the first driving transistor DT1 of the first subpixel P1 may be applied to the first electrode 120 of the defective first subpixel P1 through the first capacitor Cst1 and the first anode line AL1.

When a defect occurs in the second driving transistor DT2 of one second subpixel P2, the repair process of connecting the defective second subpixel P2 with the normal second subpixel P2 may be performed. When a defect occurs in the third driving transistor DT3 of one third subpixel P3, the repair process of connecting the defective third subpixel P3 with the normal third subpixel P3 may be performed. Also, when a defect occurs in the fourth driving transistor DT4 of one fourth subpixel P4, the repair process of connecting the defective fourth subpixel P4 with the normal fourth subpixel P4 may be performed. Since the repair processes for the second to fourth subpixels P2, P3 and P4 is substantially the same as that for the first subpixel P1, their detailed description will be omitted.

The bank 125 may be provided over the planarization layer PLN. In addition, the bank 125 may be provided between the first electrodes 120. The bank 125 may be provided to cover or at least partially cover edges of each of the first electrodes 120 and expose a portion of each of the first electrodes 120. Therefore, the bank 125 may prevent light emission efficiency from being deteriorated by a current concentrated on each end of the first electrodes 120.

The bank 125 may define the light emission areas EA1, EA2, EA3 and EA4 of each of the subpixels P1, P2, P3 and P4. The light emission areas EA1, EA2, EA3 and EA4 of each of the subpixels P1, P2, P3 and P4 refer to areas in which the first electrode 120, the organic light emitting layer 130, and the second electrode 140 are sequentially deposited so that holes from the anode electrode 120 and electrons from the second electrode 140 are combined with each other in the organic light emitting layer 130 to emit light. In this case, since the area in which the bank 125 is provided does not emit light, the area may be a non-light emission area, and the area in which the bank 125 is not provided and the first electrode 120 is exposed may be the light emission areas EA1, EA2, EA3 and EA4.

The bank 125 may be formed of an organic layer, for example, acryl resin, epoxy resin, phenolic resin, polyamide resin, polyimide resin, etc.

The organic light emitting layer 130 may be provided over the first electrode 120. The organic light emitting layer 130 may include a hole transporting layer, a light emitting layer, and an electron transporting layer. In this case, if a voltage is applied to the first electrode 120 and the second electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided for the subpixels P1, P2, P3 and P4. For example, the organic light emitting layer 130 may be a white light emitting layer emitting white light.

In another embodiment, the organic light emitting layer 130 may include light emitting layers provided per subpixels P1, P2, P3 and P4. For example, a green light emitting layer emitting green light may be provided in the first subpixel P1, a red light emitting layer emitting red light may be provided in the second subpixel P2, a white light emitting layer emitting white light may be provided in the third subpixel P3, and a blue light emitting layer emitting blue light may be provided in the fourth subpixel P4. In this case, the light emitting layers of the organic light emitting layer 130 are not provided in the transmissive area TA.

The second electrode 140 may be provided over the organic light emitting layer 130 and the bank 125. The second electrode 140 may be provided in the transmissive area TA as well as the non-transmissive area NTA that includes the emission area EA, but is not limited thereto. The second electrode 140 may be provided only in the non-transmissive area NTA that includes the emission area EA, but may not be provided in the transmissive area TA to improve transmittance.

The second electrode 140 may be a common layer commonly provided in the subpixels P1, P2, P3 and P4 to apply the same voltage. The second electrode 140 may be formed of a conductive material that may transmit light. For example, the second electrode 140 may be formed of a low resistance metal material, for example, Ag, or alloy of Mg and Ag. The second electrode 140 may be a cathode electrode.

An encapsulation layer 150 may be provided over the light emitting diodes. The encapsulation layer 150 may be provided over the second electrode 140 to overlay the second electrode 140. The encapsulation layer 150 serves to prevent oxygen or water from being permeated into the organic light emitting layer 130 and the second electrode 140. Accordingly, in some embodiments, the encapsulation layer 150 may include at least one inorganic layer and at least one organic layer.

Meanwhile, although not shown in FIG. 6 and FIG. 8, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels P1, P2, P3 and P4. In detail, the color filter CF may include a first color filter, a second color filter, and a third color filter. The first color filter may be disposed to correspond to the emission area EA1 of the first subpixel P1, and may be a green color filter that transmits green light. The second color filter may be disposed to correspond to the emission area EA2 of the second subpixel P2, and may be a red color filter that transmits red light. The third color filter may be disposed to correspond to the emission area EA3 of the third subpixel P3, and may be a blue color filter that transmits blue light.

The color filter CF may further include a fourth color filter disposed to correspond to the emission area EA4 of the fourth subpixel P4. In this case, the fourth color filter may be made of a transparent organic material that transmits white light.

Meanwhile, a black matrix BM may be provided between color filters CF and between the color filter CF and the transmissive area TA. The black matrix BM may be disposed between the subpixels P1, P2, P3 and P4 to prevent a color mixture from occurring between adjacent subpixels P1, P2, P3 and P4. In addition, the black matrix BM may be provided between the subpixels P1, P2, P3 and P4 and the transmissive area TA so that light emitted from the subpixels P1, P2, P3 and P4 may not move to a side, for example, the transmissive area TA.

The black matrix BM may include a material that absorbs light, for example, a black dye that fully absorbs light of a visible light wavelength range.

In the transparent display panel 110 according to one embodiment of the present disclosure, when a defective subpixel occurs, the defective subpixel may be connected with its adjacent subpixel by the anode line AL. At this time, the anode line AL may be provided on the same layer as the first electrode 120 of the defective subpixel, and may be extended from the first electrode 120. Since the anode line AL is connected with the first electrode 120 at one end without a separate contact hole, only one welding point WP may be provided at the other end.

In the transparent display panel 110 according to one embodiment of the present disclosure described as above, since only one welding point WP for irradiating a laser to connect a defective subpixel with a normal subpixel is provided, the number of times for irradiating the laser and an area to where the laser is irradiated may remarkably be reduced during the welding process. Therefore, the transparent display panel 110 according to one embodiment of the present disclosure may reduce an influence on the circuit area or the light emitting element as the laser is irradiated.

Since the laser is irradiated to the welding point WP, the welding point WP may be disposed on the transmissive area TA by being spaced apart from the circuit area or the light emitting element in order to reduce or minimize the influence of the laser, and it is beneficial to have a predetermined area or a selected area. In the transparent display panel 110 according to one embodiment of the present disclosure, as the number of the welding points WP is reduced, the area where the welding point WP is provided in the transmissive area TA may remarkably be reduced. Therefore, the transparent display panel 110 according to one embodiment of the present disclosure may reduce or minimize deterioration of light transmittance, which is caused by the formation of the welding point WP.

In addition, in the transparent display panel 110 according to one embodiment of the present disclosure, the anode line AL of the defective subpixel may directly be connected with the source electrode SE or the drain electrode DE of the driving transistor DT of the normal subpixel or the second capacitor electrode CE2 of the capacitor Cst at the welding point WP. At this time, in the transparent display panel 110 according to one embodiment of the present disclosure, the anode line AL of the defective subpixel may be spaced apart from the first electrode 120 of the normal subpixel and thus may not be directly connected with the first electrode 120 of the normal subpixel.

Therefore, in the transparent display panel 110 according to one embodiment of the present disclosure, even though a short occurs between the first electrode 120 of the normal subpixel and the second electrode 140 due to particles, the signal from the driving transistor DT of the normal subpixel may be applied to the defective subpixel. In this case, the defective subpixel may indicate a subpixel in which a defect occurs in the driving transistor DT, and the normal subpixel may indicate a subpixel in which a defect does not occur in the driving transistor DT.

For example, particles may occur on an upper surface of the first electrode 120 of the normal subpixel during the manufacturing process, and a short may occur between the first electrode 120 and the second electrode 140 due to the particles. In this case, when the anode line AL of the defective subpixel is connected with the first electrode 120 of the normal subpixel, the first electrode 120 of the normal subpixel fails to transfer the signal of the driving transistor DT to the anode line AL of the defective subpixel because the first electrode 120 of the normal subpixel causes a short with the second electrode 140.

On the other hand, when the anode line AL of the defective subpixel is directly connected with the driving transistor DT or the capacitor Cst of the normal subpixel like the transparent display panel 110 according to one embodiment of the present disclosure, the signal from the driving transistor DT of the normal subpixel may be applied to the anode line AL of the defective subpixel even though a short occurs between the first electrode 120 of the normal subpixel and the second electrode 140.

In addition, in the transparent display panel 110 according to one embodiment of the present disclosure, only one of the first to fourth anode lines AL1, AL2, AL3 and AL4 may be disposed at a plurality of sides of the transmissive area TA. In the transparent display panel 110 according to one embodiment of the present disclosure, since a plurality of anode lines are not disposed at one side of the transmissive area TA, one anode line does not need to be extended by bypassing a welding point of another anode line. Therefore, in the transparent display panel 110 according to one embodiment of the present disclosure, each length of the first to fourth anode lines AL1, AL2, AL3 and AL4 may be reduced or minimized. The transparent display panel 110 according to one embodiment of the present disclosure may minimize deterioration of light transmittance, which is caused by the anode line AL.

In addition, in the transparent display panel 110 according to one embodiment of the present disclosure, the connection electrode ACE1, which connects two divided electrodes 121 and 122 with each other, is not protruded toward the transmissive area TA, whereby a size of the transmissive area TA may not be reduced by the connection electrode ACE1. That is, in the transparent display panel 110 according to another embodiment of the present disclosure, light transmittance may be prevented from being reduced by the connection electrode ACE1.

In addition, in the transparent display panel 110 according to another embodiment of the present disclosure, the connection electrode ACE1 is provided in a straight line, whereby the boundary of the transmissive area TA may not have an uneven shape. Therefore, in the transparent display panel 110 according to one embodiment of the present disclosure, haze may be reduced, and image readability may be improved.

In the transparent display panel 110 according to one embodiment of the present disclosure, the first to fourth driving transistors DT1, DT2, DT3 and DT4 may be disposed to be symmetrical with one another. In detail, the first driving transistor DT1 of the first subpixel P1 may be symmetrical with the second driving transistor DT2 of the second subpixel P2 based on a second axis (e.g., Y-axis). The third driving transistor DT3 of the third subpixel P3 may be symmetrical with the fourth driving transistor DT4 of the fourth subpixel P4 based on the second axis (e.g., Y-axis). The first driving transistor DT1 of the first subpixel P1 and the second driving transistor DT2 of the second subpixel P2 may be symmetrical with the third driving transistor DT3 of the third subpixel P3 and the fourth driving transistor DT4 of the fourth subpixel P4 based on a first axis (e.g., X-axis).

In addition, in the transparent display panel 110 according to another embodiment of the present disclosure, the first to fourth capacitors Cst1, Cst2, Cst3 and Cst4 may be disposed to be symmetrical with one another. In detail, the first capacitor Cst1 of the first subpixel P1 may be symmetrical with the second capacitor Cst2 of the second subpixel P2 based on the second axis (e.g., Y-axis). The third capacitor Cst3 of the third subpixel P3 may be symmetrical with the fourth capacitor Cst4 of the fourth subpixel P4 based on the second axis (e.g., Y-axis). The first capacitor Cst of the first subpixel P1 and the second capacitor Cst2 of the second subpixel P2 may be symmetrical with the third capacitor Cst3 of the third subpixel P3 and the fourth capacitor Cst4 of the fourth subpixel P4 based on the first axis (e.g., X-axis).

In the transparent display panel 110 according to one embodiment of the present disclosure described as above, the driving transistor DT and the capacitor Cst may be spaced apart from the second signal line SL2, particularly the pixel power line VDDL and the common power line VSSL. As a result, in the transparent display panel 110 according to another embodiment of the present disclosure, parasitic capacitance may not occur or may be minimized between the driving transistor DT and the capacitor Cst and the second signal line SL2.

In the transparent display panel 110 shown in FIGS. 3 to 8, the plurality of sides of the pixel P are provided in a diagonal line with respect to the first signal line SL1 and the second signal line SL2, but are not limited thereto. Hereinafter, a modified embodiment of the pixel P shown in FIG. 3 will be described with reference to FIGS. 9 and 10.

Figure 9:
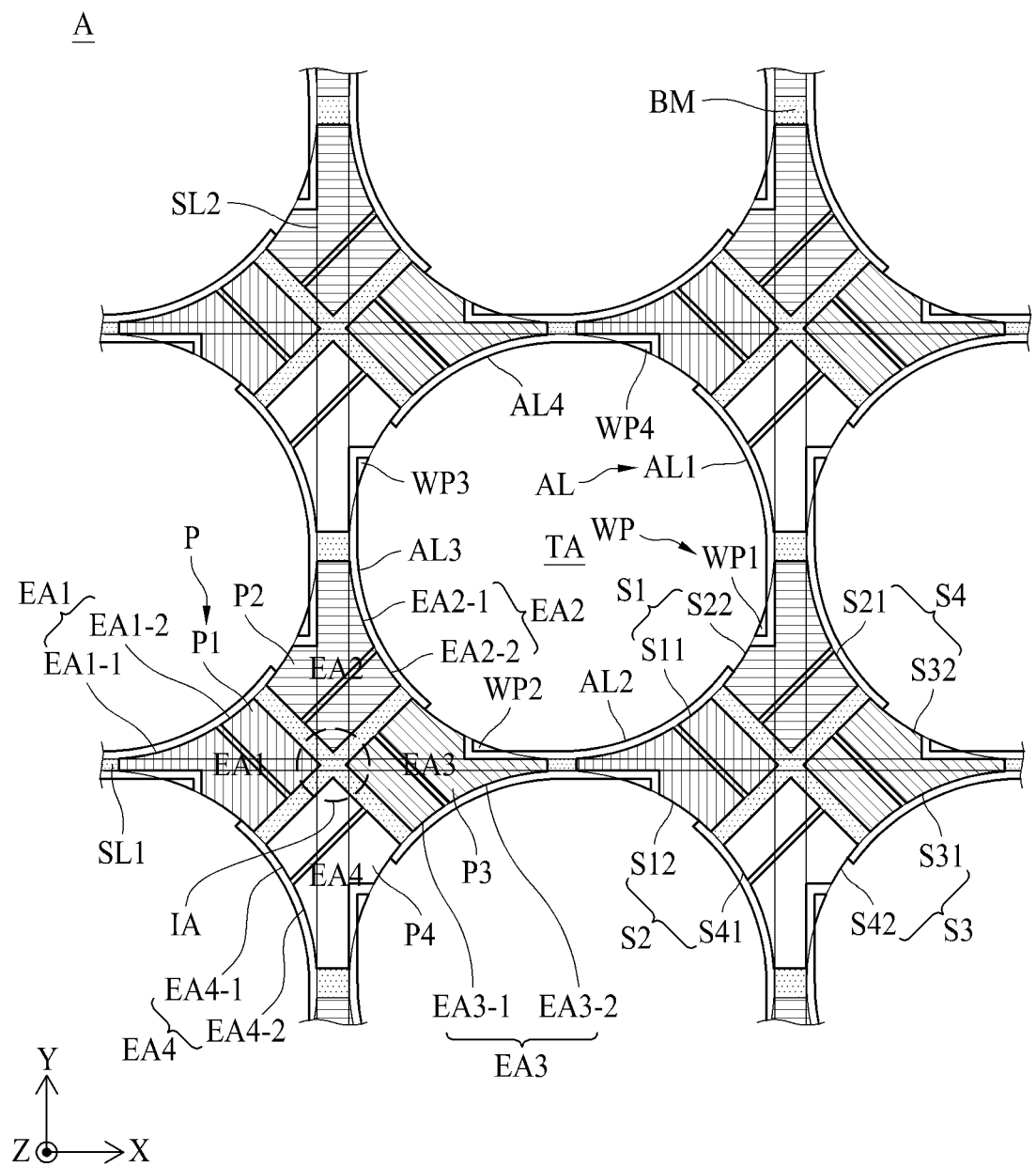
FIG. 9 is a view illustrating a modified example of FIG. 3.
Figure 10:
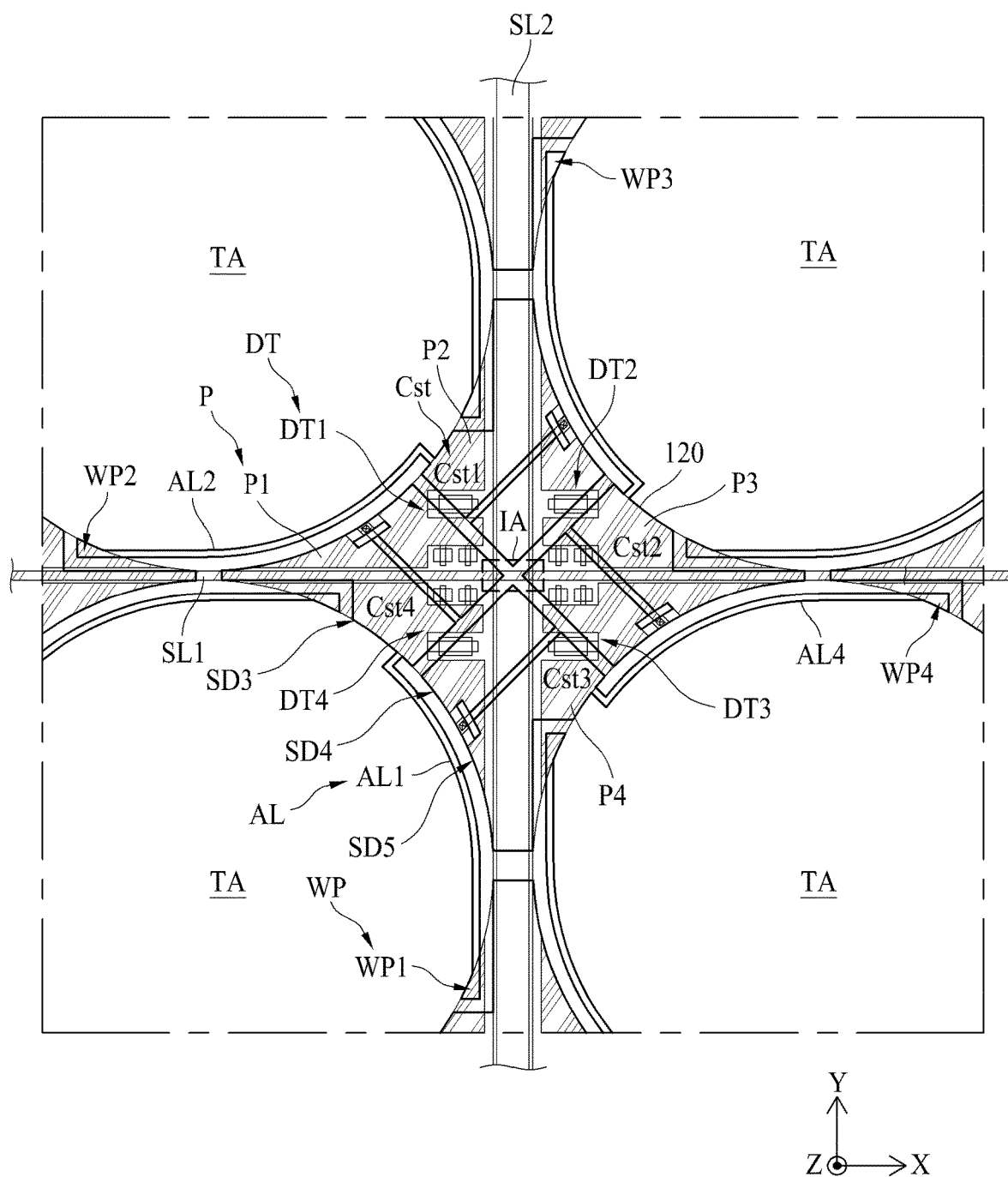
FIG. 10 is a schematic view illustrating a capacitor, a driving transistor, a first electrode, and an anode line, which are provided in a pixel of FIG. 9.

FIG. 9 is a view illustrating a modified example of FIG. 3, and FIG. 10 is a schematic view illustrating a capacitor, a driving transistor, a first electrode and an anode line, which are provided in a pixel of FIG. 9.

The pixel P shown in FIG. 9 is substantially the same as the pixel P shown in FIG. 3 except shapes of the light emission area EA and the transmission area TA. The following description will be based on difference from the pixel P shown in FIG. 3, a detailed description except the shapes of the light emission area EA and the transmissive area TA will be omitted.

In the transparent display panel 110 according to one embodiment of the present disclosure, the pixel P may include a plurality of sides facing the transmissive area TA, and each of the plurality of sides of the pixel P may have an inclination with respect to each of the first signal line SL1 and the second signal line SL2.

In detail, the pixel P may include a first side S1 and a second side S2, which face the transmissive area TA, a third side S3 facing the first side S1, and a fourth side S4 facing the second side S2.

Each of the first side S1, the second side S2, the third side S3 and the fourth side S4 of the pixel P may have an inclination without being parallel with or perpendicular to the first signal line SL1. Each of the first side S1, the second side S2, the third side S3 and the fourth side S4 of the pixel P may be formed of a curved line recessed toward the overlapping area IA. In this case, the transmissive area TA may have a rectangular shape with rounded corners, a circular shape or an oval shape depending on the size and arrangement of the pixel P. Further, as shown, each of the first side S1, the second side S2, the third side S3 and the fourth side S4 of the pixel P may each have a selected curvature.

When the non-transmissive areas NTA are disposed at a predetermined interval (or in some embodiments, a selected interval), a slit, specifically the transmissive area TA having a rectangular shape may be provided between the non-transmissive areas NTA. When external light passes through the slit, a diffraction phenomenon may occur.

According to the diffraction phenomenon, light corresponding to plane waves may be changed to spherical waves as the light passes through the slit and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced.

In the transparent display panel 110 according to the modified embodiment of the present disclosure, each of the plurality of sides S1, S2, S3 and S4 of the pixel P is formed in a curve line that is recessed toward the overlapping area IA, whereby a diffraction phenomenon may be prevented from occurring in the external light passing through the transmissive area TA.

The transparent display panel 110 according to the modified embodiment of the present disclosure may include a driving transistor DT and a capacitor Cst in the non-transmissive area NTA as shown in FIG. 10.

The driving transistor DT may include a first driving transistor DT1 disposed over the first side of the first signal line SL1 and the second side of the second signal line SL2 and provided between the transmissive area TA and the overlapping area IA, a second driving transistor DT2 disposed to be symmetrical with the first driving transistor DT1 based on the second signal line SL2, a third driving transistor DT3 disposed to be symmetrical with the second driving transistor DT2 based on the first signal line SL1, and a fourth driving transistor DT4 disposed to be symmetrical with the third driving transistor DT3 based on the second signal line SL2.

The capacitor Cst may include a first capacitor Cst1 disposed between the first driving transistor DT1 and the transmissive area TA, a second capacitor Cst2 disposed between the second driving transistor DT2 and the transmissive area TA, a third capacitor Cst3 disposed between the third driving transistor DT3 and the transmissive area TA, and a fourth capacitor Cst4 disposed between the fourth driving transistor DT4 and the transmissive area TA.

At least one of the capacitor Cst, which faces the transmissive area TA, may have the same shape as that of the pixel P. In detail, at least one of the capacitor Cst, which faces the transmissive area TA, may have an inclination with respect to each of the first signal line SL1 and the second signal line SL2.

The capacitor Cst may include one first side facing the transmissive area TA. The first side of the capacitor Cst may have an inclination without being parallel with or perpendicular to the first signal line SL1 and the second signal line SL2. In addition, the first side of the capacitor Cst may be formed of a curved line toward the overlapping area IA.

The capacitor Cst may be provided to have a maximum wide area in the pixel P. Accordingly, in some embodiments, in the transparent display panel 110 according to the modified embodiment of the present disclosure, the shape of the side of the first side of the capacitor Cst may be the same as the side facing the transmissive area TA of the subpixels P1, P2, P3 and P4. Moreover, in the transparent display panel 110 according to the modified embodiment of the present disclosure, an end of the first side of the capacitor Cst may be the same as an end of the side facing the transmissive area TA of the subpixels P1, P2, P3 and P4.

In the transparent display panel 110 according to the modified embodiment of the present disclosure, as shown in FIG. 10, at least one side facing the transmissive area TA of the first electrode 120 may have the same shape as that of the first side of the capacitor Cst. In detail, the first electrode 120 may be formed of a curved line in which at least one side facing the transmissive area TA is recessed toward the overlapping area IA. In one embodiment, the capacitor Cst may have the same end as that of the first electrode 120 at the side facing the transmissive area TA.

In the transparent display panel 110 according to the modified embodiment of the present disclosure, the first side of the capacitor Cst may be formed of a curved line toward the overlapping area IA, whereby the transmissive area TA having a rectangular shape with rounded corners, a circular shape or an oval shape may easily be formed. In addition, the transparent display panel 110 according to the modified embodiment of the present disclosure may make sure of high transmittance while making sure of a maximum size of the light emission area EA as the side facing the transmissive area TA of the subpixels P1, P2, P3 and P4 is provided along the first side of the capacitor Cst.

In some embodiments, the pixel P includes a plurality of subpixels including the first subpixel P1, the second subpixel P2, the third subpixel P3, and the fourth subpixel P4. These subpixels are disposed to overlap either the first signal line SL1 or the second signal line SL2. However, in other embodiments, each piece of the subpixels may overlap with the overlapping area IA based on the dimension (e.g., width, thickness, etc.) of the first and second signal lines.

As shown in FIG. 10, the first subpixel P1 which has two pieces to it (EA1-1, EA1-2), includes a piece (namely, the EA1-1) that overlaps with the first signal line SL1 but not with the second signal line SL2 from the top view. On other hand, the second subpixel P2 which also has two pieces to it (EA2-1, EA2-2), includes a piece (namely, the EA2-1) that overlaps with the second signal line SL2 but not with the first signal line SL1 from the top view or the plan view as shown in FIGS. 9 and 10.

In addition, each subpixel of the plurality of subpixels have a side facing the transmissive area. For example, the first subpixel P1 has a third side SD3 (see the side of EA1-1 in FIG. 10) and the fourth subpixel P4 has a fourth side SD4 (see the side of EA4-1 in FIG. 10) and a fifth side SD5 (see the side of EA4-2 in FIG. 10). All of these sides, SD3, SD4, SD5 faces the same transmissive area TA.

Each side of the subpixel SD3, SD4, SD5 facing a same transmissive area TA has a same curvature. Here, because the transmissive area TA is illustrated as a circle, the curvature may be roughly about the reciprocal of the radius of the circular transmissive area TA.

Figure 11:
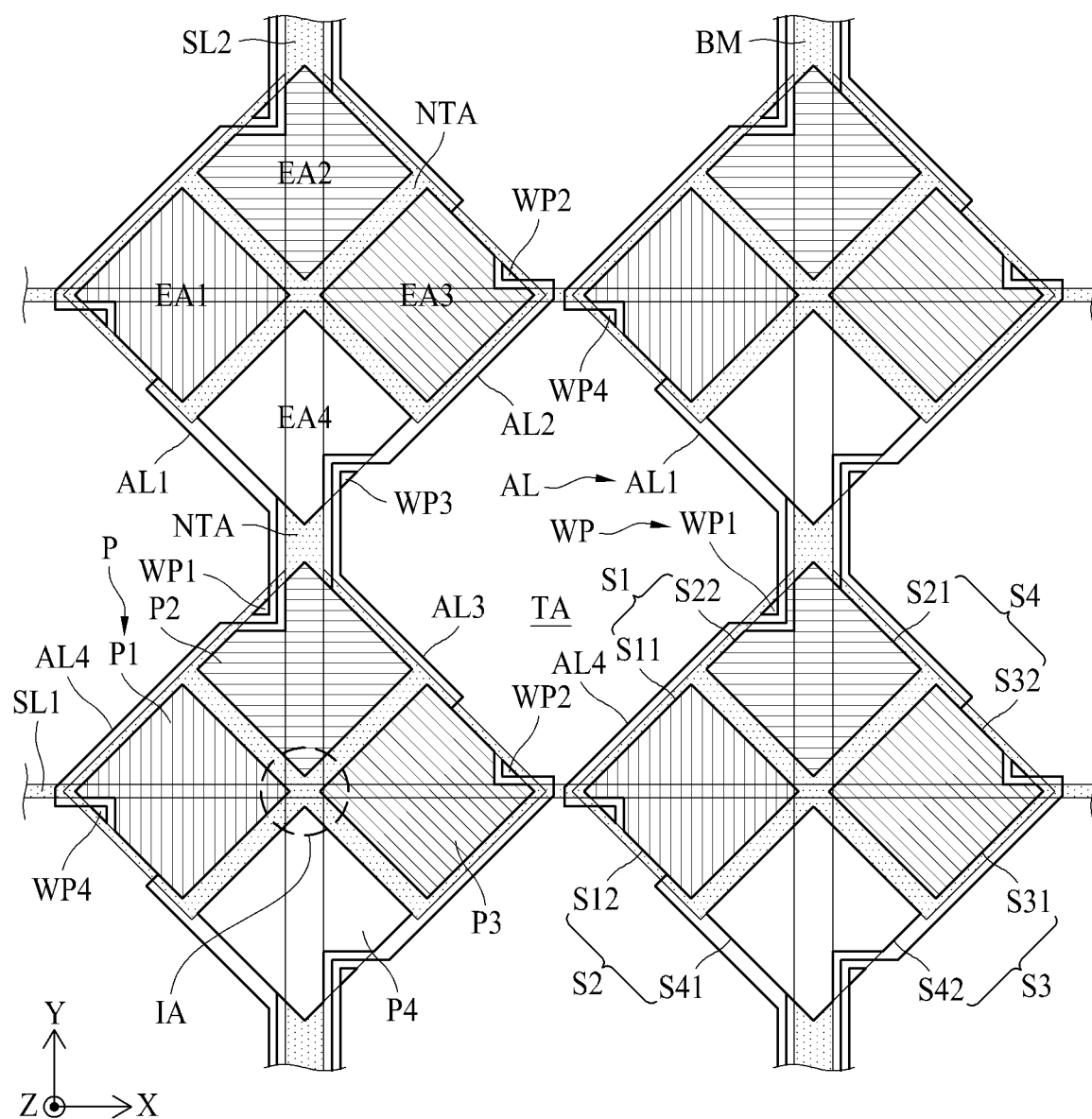
FIG. 11 is an enlarged view illustrating another example in an area A of FIG. 2.
Figure 12:
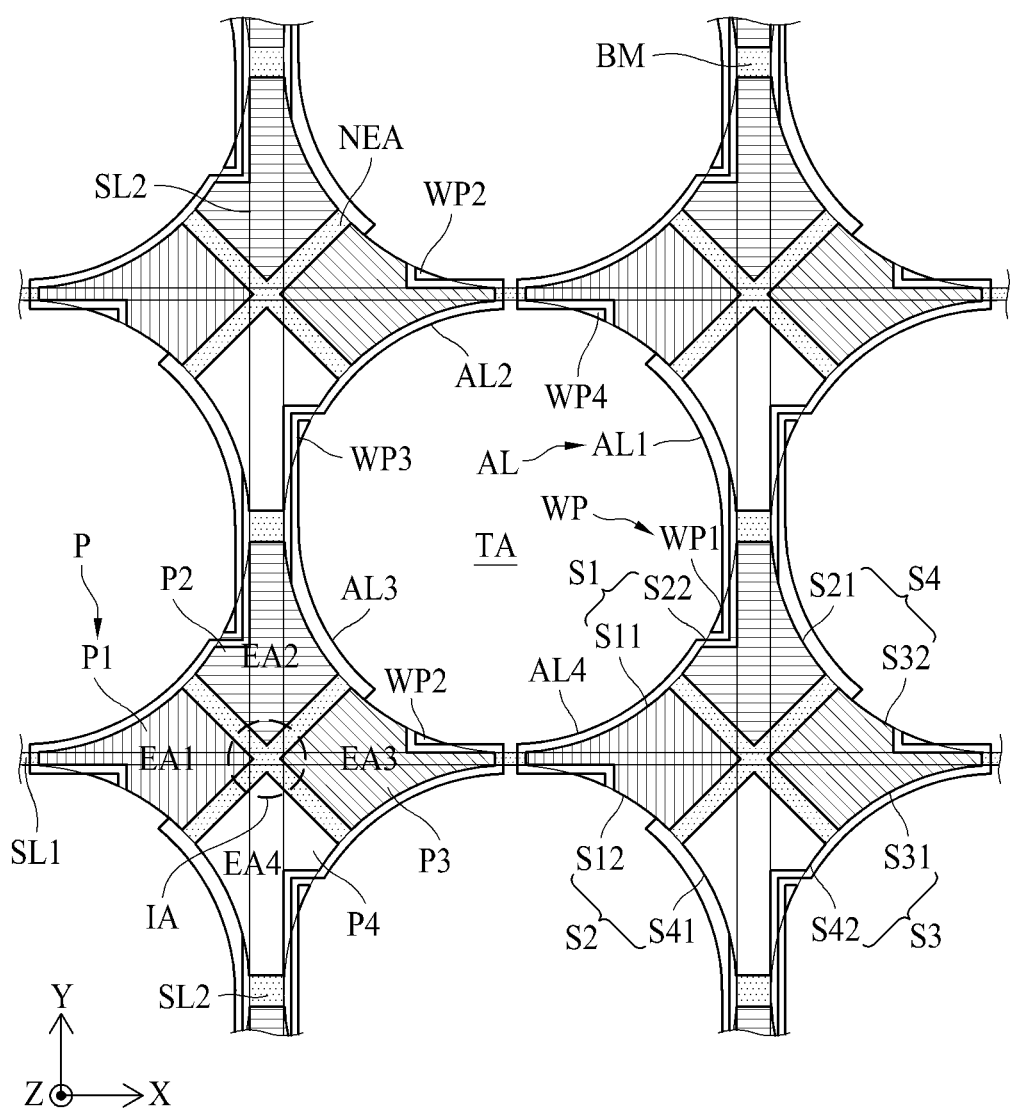
FIG. 12 is a view illustrating a modified example of FIG. 11.

FIG. 11 is an enlarged view illustrating another example in an area A of FIG. 2, and FIG. 12 is a view illustrating a modified example of FIG. 11.

The transparent display panel 110 shown in FIG. 11 is different from the transparent display panel 110 shown in FIG. 3 in that the first to fourth anode lines AL1, AL2, AL3 and AL4 are all extended in the second direction.

The following description will be based on the first to fourth anode lines AL1, AL2, AL3 and AL4, and a detailed description of the substantially same elements as those of the transparent display panel 110 shown in FIGS. 3 to 9 will be omitted.

In the transparent display panel 110 according to another embodiment of the present disclosure, a signal of a subpixel, which has the same color as that of a defective subpixel and is adjacent to the defective subpixel, may be applied to the defective subpixel through the anode line AL.

In detail, in the transparent display panel 110 according to another embodiment of the present disclosure, the anode line AL may be provided over at least one side of the transmissive area TA. The anode line AL may be extended from the first electrode 120 of each of the plurality of subpixels P1, P2, P3 and P4 and at least a portion thereof may overlap the capacitor Cst electrically connected with the driving transistor DT of another adjacent subpixel having the same color. The anode line AL may include a first anode line AL1, a second anode line AL2, a third anode line AL3, and a fourth anode line AL4.

The first anode line AL1 may be provided between two first subpixels P1 adjacent to each other in the second direction with the transmissive area TA interposed therebetween. The first anode line AL1 may be protruded from the first electrode 120 of one of the two first subpixels P1 disposed to be adjacent to each other in the second direction, and then may be extended toward the other first subpixel P1.

The first subpixels P1 may be disposed to be adjacent to each other in the second direction with the third subpixel P3 interposed therebetween. In this case, the first anode line AL1 may be extended from the first electrode 120 of each of the first subpixels P1, and at least a portion thereof may overlap the first capacitor Cst1 of the first subpixel P1 adjacent thereto in the second direction.

For example, the first anode line AL1 may be protruded from the first electrode 120 of each of the first subpixels P1 and extended along at least one of the plurality of sides of the transmissive area TA. The first capacitor Cst may be disposed between the transmissive area TA and the overlapping area IA between the first side of the first signal line SL1 and the first side of the second signal line SL1. A portion of the second capacitor electrode CE2 of the first capacitor Cst1 may not be covered by the first electrode 120 at one side to contact the first anode line AL1. In another embodiment, the second capacitor electrode CE2 of the first capacitor Cst1 may be provided with a protrusion portion protruded from one side toward the transmissive area TA to contact the first anode line AL1. Therefore, at least a portion of the first anode line AL1 may overlap the second capacitor electrode CE2 of the first capacitor Cst1 of the first subpixel P1 adjacent thereto in the second direction, whereby the first welding point WP1 may be provided.

The second anode line AL2 may be provided between two second subpixels P2 disposed to be adjacent to each other in the second direction. The second anode line AL2 may be protruded from the first electrode 120 of one of the two second subpixels P2 disposed to be adjacent to each other in the second direction, and may be extended toward the other second subpixel P2.

The second subpixels P2 may be disposed in the second direction with the fourth subpixel P4 interposed therebetween. In this case, the second anode line AL2 may be extended from the first electrode 120 of each of the second subpixels P2 in the second direction to pass through the fourth pixel P4, and then at least a portion thereof may overlap the second capacitor Cst2 of the second subpixel P2 adjacent thereto in the second direction.

The second capacitor Cst2 may be disposed to be symmetrical with the first capacitor Cst1 based on the second signal line SL2, and may be disposed between the transmissive area TA and the overlapping area IA. A portion of the second capacitor electrode CE2 of the second capacitor Cst2 may not be covered by the first electrode 120 at one side to contact the second anode line AL2. In another embodiment, the second capacitor electrode CE2 of the second capacitor Cst2 may be provided with a protrusion portion protruded from one side toward the transmissive area TA to contact the second anode line AL2. Therefore, at least a portion of the second anode line AL2 may overlap the second capacitor electrode CE2 of the second capacitor Cst2 of the second subpixel P2 adjacent thereto in the second direction, whereby the second welding point WP2 may be provided.

The third anode line AL3 may be provided between two third subpixels P3 adjacent to each other in the second direction with the transmissive area TA interposed therebetween. The third anode line AL3 may be protruded from the first electrode 120 of one of the two third subpixels P3 disposed to be adjacent to each other in the second direction, and may be extended toward the other third subpixel P3.

The third subpixels P3 may be disposed to be adjacent to each other in the second direction with the transmissive area TA interposed therebetween. In this case, the third anode line AL3 may be extended from the first electrode 120 of each of the third subpixels P3, and at least a portion thereof may overlap the third capacitor Cst3 of the third subpixel P3 adjacent thereto in the second direction.

For example, the third anode line AL3 may be protruded from the first electrode 120 of each of the third subpixels P3 and then extended along at least one of the plurality of sides of the transmissive area TA. The third capacitor Cst3 may be disposed to be symmetrical with the second capacitor Cst2 based on the first signal line SL1, and may be disposed between the transmissive area TA and the overlapping area IA. A portion of the second capacitor electrode CE2 of the third capacitor Cst3 may not be covered by the first electrode 120 at one side to contact the third anode line AL3. In another embodiment, the second capacitor electrode CE2 of the third capacitor Cst3 may be provided with a protrusion portion protruded from one side toward the transmissive area TA to contact the third anode line AL3. Therefore, at least a portion of the third anode line AL3 may overlap the second capacitor electrode CE2 of the third capacitor Cst3 of the third subpixel P3 adjacent thereto in the second direction, whereby the third welding point WP3 may be provided.

The fourth anode line AL4 may be provided between two fourth subpixels P4 disposed to be adjacent to each other in the second direction. The fourth anode line AL4 may be protruded from the first electrode 120 of one of the two fourth subpixels P4 disposed to be adjacent to each other in the second direction, and may be extended toward the other fourth subpixel P4.

The fourth subpixels P4 may be disposed in the second direction with the second subpixel P2 interposed therebetween. In this case, the fourth anode line AL4 may be extended from the first electrode 120 of each of the fourth subpixels P4 in the second direction to pass through the second subpixel P2, and then at least a portion thereof may overlap the fourth capacitor Cst4 of the fourth subpixel P4 adjacent thereto in the second direction.

The fourth capacitor Cst4 may be disposed to be symmetrical with the third capacitor Cst3 based on the second signal line SL2, and may be disposed between the transmissive area TA and the overlapping area IA. A portion of the second capacitor electrode CE2 of the fourth capacitor Cst4 may not be covered by the first electrode 120 at one side to contact the fourth anode line AL4. In another embodiment, the second capacitor electrode CE2 of the fourth capacitor Cst4 may be provided with a protrusion portion protruded from one side toward the transmissive area TA to contact the fourth anode line AL4. Therefore, at least a portion of the fourth anode line AL4 may overlap the second capacitor electrode CE2 of the fourth capacitor Cst4 of the fourth subpixel P4 adjacent thereto in the second direction, whereby the fourth welding point WP4 may be provided.

Each of the first to fourth anode lines AL1, AL2, AL3 and AL4 disposed as above may be connected with the first electrode 120 of the subpixel at one end. In addition, each of the first to fourth anode lines AL1, AL2, AL3 and AL4 may electrically be separated from the driving transistor DT or the capacitor Cst at the welding points WP1, WP2, WP3 and WP4 provided at the other end thereof with at least one insulating layer interposed therebetween.

As a result, the signal applied to one subpixel may not be applied to the other subpixel adjacent thereto until the repair process is performed. However, when a defect occurs in the driving transistor of one subpixel, the repair process of connecting the subpixel having a defect with a normal subpixel may be performed.

In the transparent display panel 110 according to another embodiment of the present disclosure, when a defective subpixel occurs, the defective subpixel may be connected with its adjacent subpixel by the anode line AL. At this time, the anode line AL may be provided on the same layer as the first electrode 120 of the defective subpixel and then extended from the first electrode 120. Since the anode line AL is connected with the first electrode 120 without a separate contact hole at one end, only one welding point WP may be provided at the other end.

In the transparent display panel 110 according to another embodiment of the present disclosure, since only one welding point WP for irradiating a laser to connect a defective subpixel with a normal subpixel is provided, the number of times for irradiating the laser and an area to where the laser is irradiated may remarkably be reduced during the welding process. Therefore, the transparent display panel 110 according to another embodiment of the present disclosure may reduce an influence on the circuit area or the light emitting element as the laser is irradiated.

In addition, the transparent display panel 110 according to another embodiment of the present disclosure may reduce the area where the welding point WP is provided in the transmissive area TA by reducing the number of welding points WP. Therefore, the transparent display panel 110 according to another embodiment of the present disclosure may reduce or minimize deterioration of light transmittance, which is caused by the formation of the welding point WP.

In addition, in the transparent display panel 110 according to another embodiment of the present disclosure, the anode line AL of the defective subpixel may directly be connected with the second capacitor electrode CE2 of the capacitor Cst of the normal subpixel at the welding point WP. Therefore, even though a short occurs between the first electrode 120 of the normal subpixel and the second electrode 140 due to particles, the signal from the driving transistor DT of the normal subpixel may be applied to the defective subpixel. In this case, the defective subpixel may indicate a subpixel having a defect occurring in the driving transistor DT, and the normal subpixel may indicate a subpixel having no defect in the driving transistor DT.

In the transparent display panel 110 shown in FIG. 11, the plurality of sides of the pixel P are provided in a diagonal line having an inclination with respect to the first signal line SL1 and the second signal line SL2, but are not limited thereto.

In the transparent display panel 110 according to the modified embodiment of the present disclosure, as shown in FIG. 12, the plurality of sides of the pixel P may be formed of curved lines recessed toward the overlapping area IA. In this case, the transmissive area TA may have a rectangular shape with rounded corners, a circular shape or an oval shape depending on the size and arrangement of the pixel P. As a result, the transparent display panel 110 according to the modified embodiment of the present disclosure may prevent a diffraction phenomenon from occurring in the external light passing through the transmissive area TA.

According to the present disclosure, the following advantageous effects may be obtained.

In the present disclosure, the defective subpixel may be connected with its adjacent subpixel by the anode line extended from the first electrode. Therefore, in order to connect the defective subpixel with the normal subpixel, only one welding point for irradiating a laser may be provided, whereby the number of times for irradiating the laser and an area to where the laser is irradiated may remarkably be reduced during the welding process.

In addition, in the present disclosure, the influence on the circuit area or the light emitting element in accordance with irradiation of the laser may be reduced.

In addition, in the present disclosure, as the number of welding points is reduced, the area where the welding point is provided in the transmissive area TA may remarkably be reduced. Therefore, the present disclosure may reduce or minimize deterioration of light transmittance, which is caused by the formation of the welding point.

In addition, in the present disclosure, the anode line of the defective subpixel may directly be connected with the circuit area of the normal subpixel. Therefore, in the present disclosure, even though a short occurs between the first electrode of the normal subpixel and the second electrode due to particles, the signal from the driving transistor of the normal subpixel may be applied to the defective subpixel.

Further embodiments are provided in the present disclosure. In some embodiments, a transparent display device including the following is provided:

A plurality of first signal lines (SL1) extended in a first direction and spaced apart from each other;

A plurality of second signal lines (SL2) extended in a second direction and spaced apart from each other, the second direction being transverse to the first direction;

A transmissive area (TA) provided between two adjacent first signal lines and between two adjacent second signal lines;

A pixel (P) including a plurality of subpixels (P1, P2, P3, P4) disposed adjacent to an overlapping area where the first signal line and the second signal line cross each other;

A first electrode (120) provided in each of the plurality of subpixels;

A circuit area coupled with the first electrode through a contact hole;

An anode line (AL) extended from a first electrode of each of the plurality of subpixels and at least partially overlapped with a circuit area of an adjacent subpixel of the same color.

Here, the pixel includes a plurality of sides having an inclination with respect to each of the first signal line and the second signal line, and at least one anode line is disposed to be adjacent to each of the plurality of sides of the pixel.

In some embodiments, each of the plurality of sides of the pixel is a straight line, or a curved line recessed through the overlapping area.

In some embodiments, the plurality of subpixels include first subpixels overlapped with at least a portion of the first signal line, second subpixels overlapped with at least a portion of the second signal line, third subpixels facing the first subpixels with respect to the overlapping area, and fourth subpixels facing the third subpixels with respect to the overlapping area.

In some embodiments, the anode line includes:

A first anode line extended from a first electrode of each of the plurality of first subpixels and at least partially overlapped with a circuit area of a first subpixel adjacent thereto, A second anode line extended from a first electrode of each of the plurality of second subpixels and at least partially overlapped with a circuit area of a second subpixel adjacent thereto, A third anode line extended from a first electrode of each of the plurality of third subpixels and at least partially overlapped with a circuit area of a third subpixel adjacent thereto, and A fourth anode line extended from a first electrode of each of the fourth subpixels and at least partially overlapped with a circuit area of a fourth subpixel adjacent thereto.

In some embodiments, each of the first to fourth anode lines is extended along at least one of the plurality of sides of the pixel.

In some embodiments, at least one of the first to fourth anode lines is disposed to be adjacent to each of the plurality of sides of the pixel.

In some embodiments, the first anode line and the third anode line at least partially overlap a circuit area of a subpixel of the same color, which is adjacent thereto in the second direction, and the second anode line and the fourth anode line at least partially overlap a circuit area of a subpixel of a same color, which is adjacent thereto in the first direction.

In some embodiments, the pixel has a rhombus shape, and each of the plurality of subpixels has a rhombus shape.

In some embodiments, the transmissive area has a shape selected from a rhombus shape, a hexagonal shape, an octagonal shape, or a circular shape.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
   a plurality of first signal lines extended in a first direction and spaced apart from each other;
   a plurality of second signal lines extended in a second direction and spaced apart from each other, the second direction being transverse to the first direction;
   a transmissive area provided between two adjacent first signal lines and between two adjacent second signal lines;
   a pixel including a plurality of subpixels disposed adjacent to an overlapping area where the first signal line and the second signal line cross each other;
   a first electrode provided in each of the plurality of subpixels, which are disposed to be adjacent to the transmissive area, the first electrode including a first side and a second side, the first side having a first inclination with respect to the first signal line and the second side having a second inclination with respect to the second signal line;
   a circuit element coupled with the first electrode through a contact hole disposed to be adjacent to the first side of the first electrode, the circuit element including a capacitor having a first capacitor electrode and a second capacitor electrode;
   an anode line extended from the second side of the first electrode of each of the plurality of subpixels and configured to electrically connect with the first electrode of an adjacent subpixel of a same color and form a welding point,
   wherein at least a portion of the anode line overlaps the second capacitor electrode of the capacitor coupled with the first electrode of the adjacent subpixel of a same color to form the welding point.

2. The transparent display device of claim 1, wherein the circuit element further includes:

a driving transistor supplying a power source to the first electrode of each of the plurality of subpixels and including an active layer, a gate electrode, a source electrode, and a drain electrode, and wherein the capacitor is coupled with the driving transistor of each of the plurality of subpixels, and wherein the second capacitor electrode of the capacitor is extended from either the source electrode or the drain electrode of the driving transistor.

3. The transparent display device of claim 2, wherein each of the driving transistor and the capacitor does not overlap each of the first signal line and the second signal line.

4. The transparent display device of claim 2, wherein the driving transistor is disposed to be closer to the overlapping area than the capacitor.

5. The transparent display device of claim 2, wherein the capacitor has one side provided in parallel with the first side or the second side of the first electrode.

6. The transparent display device of claim 2, wherein the first electrode is coupled to the second capacitor electrode of the capacitor through a contact hole disposed to be adjacent to the first side.

7. The transparent display device of claim 1, wherein the anode line is directly coupled with the second capacitor electrode of the capacitor coupled with the first electrode of the adjacent subpixel of the same color when a laser is irradiated to the welding point.

8. The transparent display device of claim 1, wherein the plurality of subpixels include first subpixels overlapped with at least a portion of the first signal line and second subpixels overlapped with at least a portion of the second signal line, and wherein the anode line includes a first anode line extended from a first electrode of each of the plurality of first subpixels and at least partially overlapped with a circuit element coupled with the first electrode of a first subpixel adjacent thereto, and a second anode line extended from a first electrode of each of the plurality of second subpixels and at least partially overlapped with a circuit element coupled with the first electrode of a second subpixel adjacent thereto.

9. The transparent display device of claim 8, wherein the first anode line is disposed between first subpixels provided in each of two pixels adjacent to each other in the second direction, and wherein the second anode line is disposed between second subpixels provided in each of two pixels adjacent to each other in the first direction.

10. The transparent display device of claim 8, wherein the first anode line is disposed between first subpixels provided in each of two pixels adjacent to each other in the second direction, and wherein the second anode line is disposed between second subpixels provided in each of two pixels adjacent to each other in the second direction.

11. The transparent display device of claim 1, wherein the first electrode includes a first divided electrode and a second divided electrode, and further includes a connection electrode for coupling the first divided electrode with the second divided electrode in a straight line.

12. The transparent display device of claim 11, wherein a boundary between the connection electrode and the transmissive area forms a straight line with a boundary between the first divided electrode and the transmissive area and a boundary between the second divided electrode and the transmissive area.

13. The transparent display device of claim 11, wherein the capacitor includes a concave portion that forms a concave area in a direction from the transmissive area toward the overlapping area, and at least a portion of the connection electrode overlaps the concave area of the capacitor.

14. The transparent display device of claim 13, further comprising a contact electrode protruded from the concave portion of the capacitor toward the transmissive area and at least partially overlapped with the connection electrode, wherein the contact electrode is coupled with the connection electrode through the contact hole.

15. A transparent display device comprising:

a first signal line extended in a first direction;

a second signal line extended in a second direction transverse to the first direction;

a transmissive area provided adjacent to an overlapping location of the first signal line and the second signal line;

a pixel including a plurality of subpixels disposed to overlap either the first signal line or the second signal line;

a first electrode provided in each of the plurality of subpixels;

a circuit element coupled with the first electrode through a contact hole disposed to be adjacent to the first side of the first electrode, the circuit element including a capacitor having a first capacitor electrode and a second capacitor electrode;

an anode line extended from the first electrode of each of the plurality of subpixels on a same layer as the first electrode, the anode line including a welding point, and wherein at least a portion of the anode line overlaps the second capacitor electrode of the capacitor coupled with the first electrode of the adjacent subpixel of a same color to form the welding point.

16. The transparent display device of claim 15, wherein each subpixel of the plurality of subpixels have a side facing the transmissive area, each side of the subpixel facing a same transmissive area having a same curvature.

17. The transparent display device of claim 16, wherein each subpixel at least two subpixels of a same color overlaps only with either the first signal line or the second signal line.

18. The transparent display device of claim 15, wherein the transmissive area facing the side of each subpixel have a corresponding curvature according to the curvature of the side of each subpixel.

19. The transparent display device of claim 18, wherein at least one of the first to fourth anode lines is disposed to be adjacent to each of the plurality of sides of the pixel.

20. The transparent display device of claim 16, wherein the anode line and the first electrode are spaced apart from each other and the welding point includes a downward protruding shape configured to electrically couple to an electrode of a capacitor coupled to a driving transistor of a subpixel when a welding process is applied.

21. The transparent display device of claim 18, wherein each subpixel emitting different colors is symmetrically arranged with each other with respect to the overlapping location of the first signal line and the second signal line.

22. The transparent display device of claim 15, wherein the anode line and the first electrode are formed at a same time based on a same process.

* * * * *